US006891152B2

(12) United States Patent
Averbukh

(10) Patent No.: US 6,891,152 B2
(45) Date of Patent: May 10, 2005

(54) NANO-LITHOGRAPHY USING SQUEEZED ATOMIC AND MOLECULAR STATES

(75) Inventor: Eliyahu Averbukh, Rehovot (IL)

(73) Assignee: Yeda Research and Development Co. Ltd., Rehovot (IL)

( * ) Notice: Subject to any disclaimer, the term of this patent is extended or adjusted under 35 U.S.C. 154(b) by 506 days.

(21) Appl. No.: 10/161,541

(22) Filed: Jun. 3, 2002

(65) Prior Publication Data

US 2003/0152841 A1 Aug. 14, 2003

(30) Foreign Application Priority Data

Jun. 3, 2001 (IL) .................................. 143538

(51) Int. Cl.[7] .............................. H01S 1/00; H01S 3/00
(52) U.S. Cl. ...................................................... 250/251
(58) Field of Search ........................................ 250/251

(56) References Cited

U.S. PATENT DOCUMENTS

| | | | | |
|---|---|---|---|---|
| 4,025,787 A | * | 5/1977 | Janner et al. ................ | 250/251 |
| 4,386,274 A | * | 5/1983 | Altshuler ..................... | 250/251 |
| 4,720,633 A | | 1/1988 | Nelson | |
| 4,880,976 A | | 11/1989 | Mancuso et al. | |
| 5,360,764 A | * | 11/1994 | Celotta et al. ............... | 427/596 |
| 5,412,211 A | | 5/1995 | Knowles | |
| 5,789,748 A | | 8/1998 | Liu et al. | |
| 5,851,725 A | | 12/1998 | McClelland ................. | 430/269 |
| 6,459,482 B1 | | 10/2002 | Singh et al. | |
| 6,784,420 B2 | * | 8/2004 | Wang et al. ................. | 250/251 |

OTHER PUBLICATIONS

G. Timp, et al., "Using Light as a Lens for Submicron, Neutral Atom Lithography", published in Physical Review Letters, vol. 69, pp. 1636–1639, 1992.
S. Meneghini, et al., "Atomic Focusing and Near–Field Imaging: A Combination for Producing Small–Period Nanostructures", published in Applied Physics B, vol. 70, pp. 675–682, 2000.
C.F. Bharucha, et al., "Dynamic Localization of Ultracold Sodium Atoms", published in Physical Review E, vol. 60, pp. 3881–3895, 1999.
R. Graham, et al., "Dynamic Localization of Atomic Beam Deflection by a Modulated Standing Light Wave", published in Physical Review A, vol. 45, pp. R19–R22, 1992.
W.H. Oskay, et al., "Ballistic Peaks at Quantum Resonance", published in Optics Communications, pp. 137–148, vol. 179, 2000.
http://atomsun.harvard.edu/~joseph/swq.html. 2000.
Roel Bosch, "Atom Lithography Boosts Nano–Magnetics", 2000.

* cited by examiner

*Primary Examiner*—John R. Lee
*Assistant Examiner*—Paul M. Gurzo
(74) *Attorney, Agent, or Firm*—Ladas & Parry LLP

(57) ABSTRACT

A method and apparatus for performing atomic and molecular nano-deposition by means of atomic or molecular focusing through a plurality of optical standing waves. A stacked set of standing light waves, preferably arranged as gratings in a predetermined form and of predetermined intensities, is used to sequentially compress or squeeze the width of the incident atomic or molecular beam into ultra-narrow, spatially localized spots or lines. The result is a focused beam of particles with improved resolution compared with prior art atomic focusing. Furthermore, spherical and chromatic aberrational effects can be reduced.

42 Claims, 16 Drawing Sheets

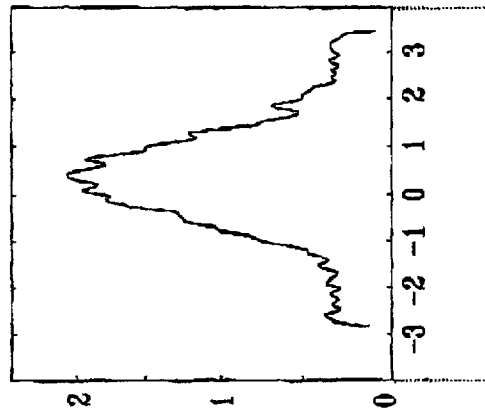
FIG. 5A
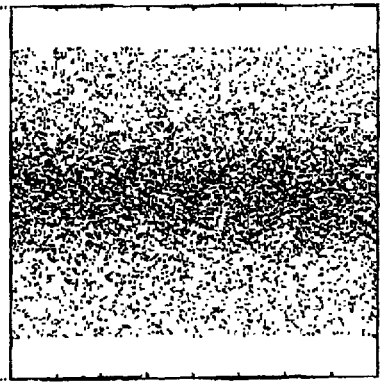
FIG. 5B
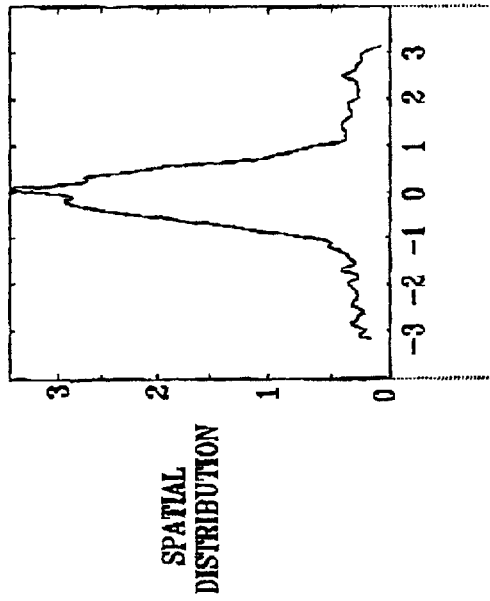
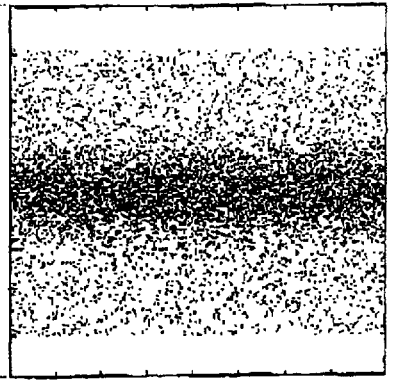
SPATIAL DISTRIBUTION
POSITION Y
POSITION X FIG. 8A
SPATIAL
DISTRIBUTION
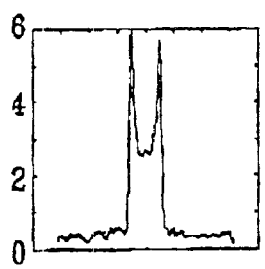 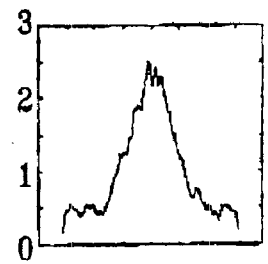
FIG. 8B
SPATIAL
DISTRIBUTION
 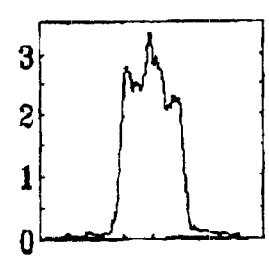
FIG. 8C
SPATIAL
DISTRIBUTION
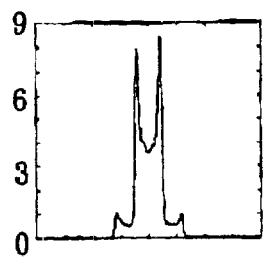 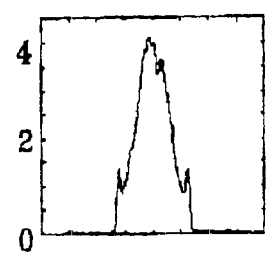
FIG. 8D
SPATIAL
DISTRIBUTION
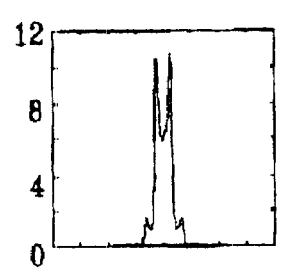 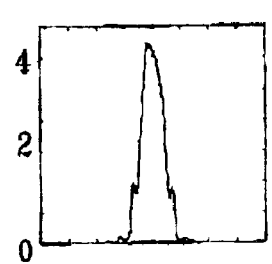
FIG. 8E
SPATIAL
DISTRIBUTION
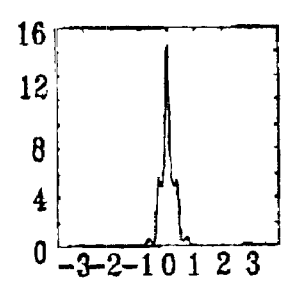 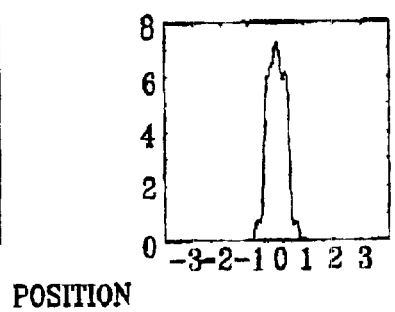
POSITION

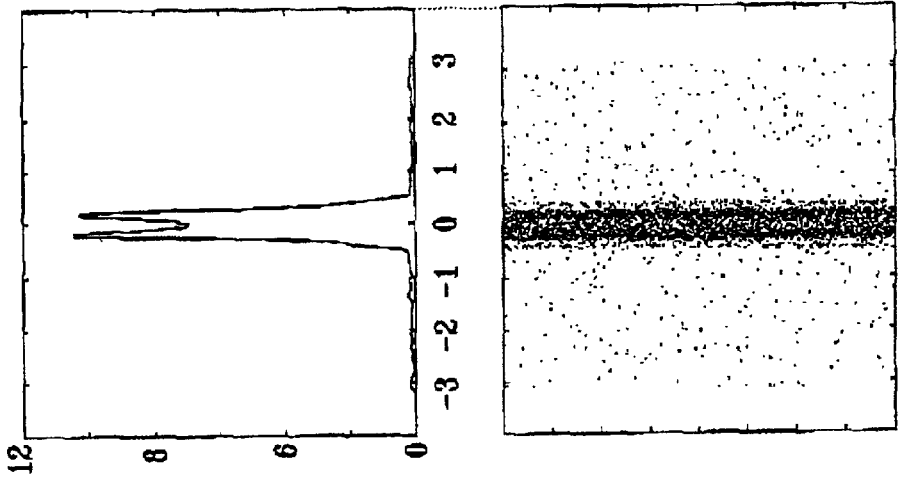
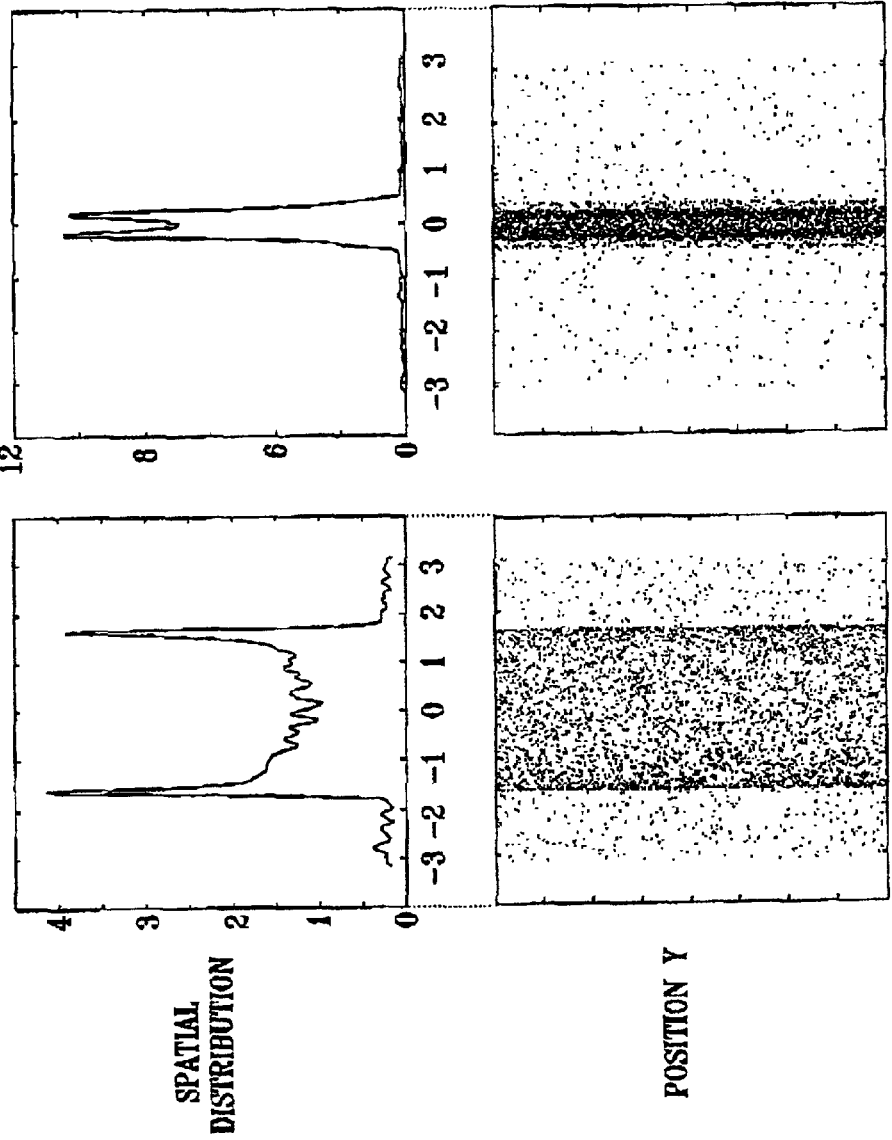

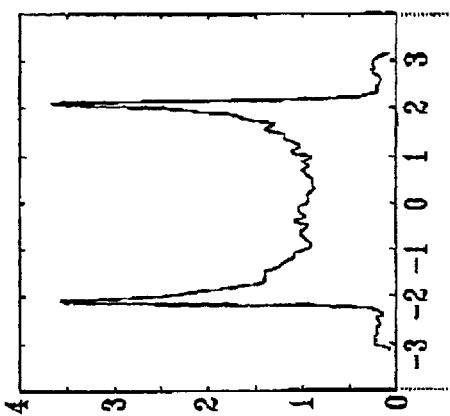
FIG. 10A
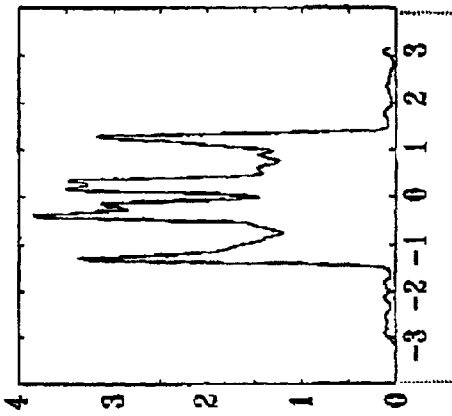
FIG. 10B
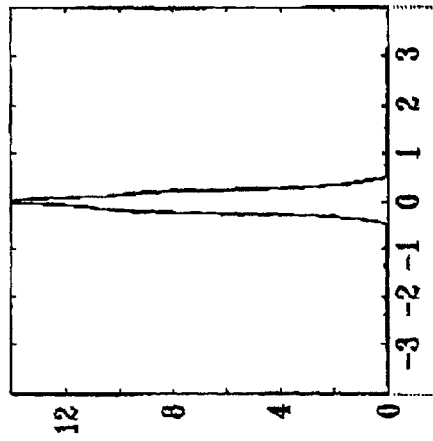
FIG. 10C
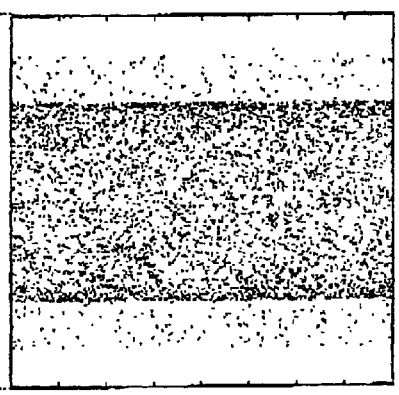
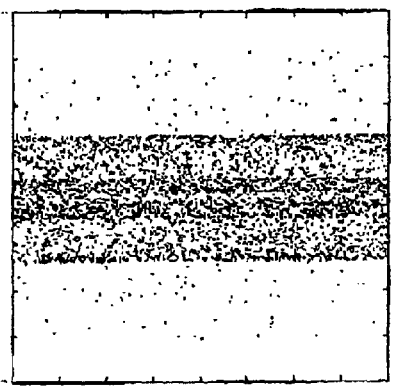
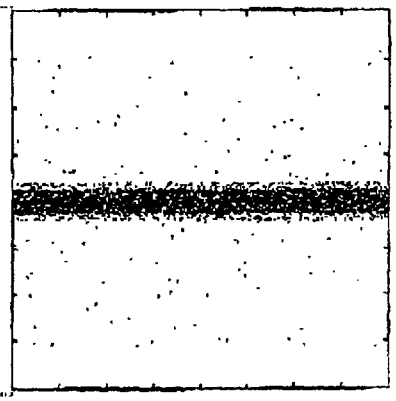

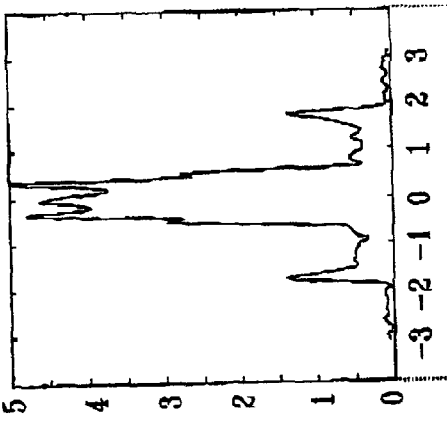
FIG. 11A
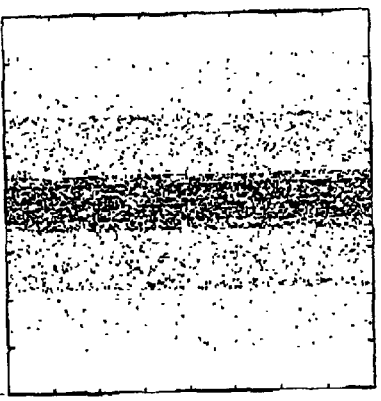
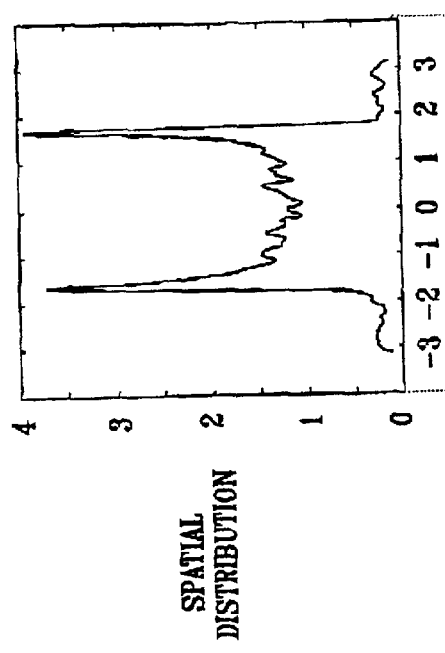
FIG. 11B
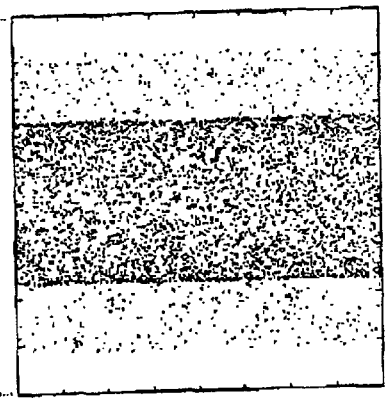

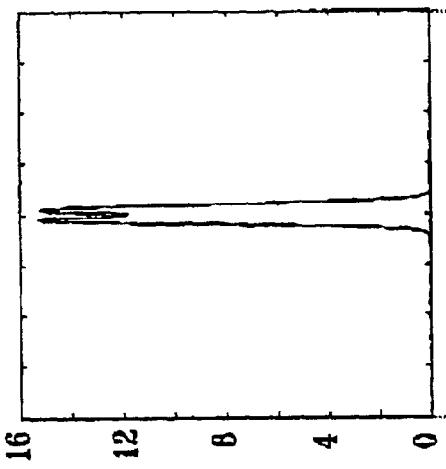
FIG. 11C
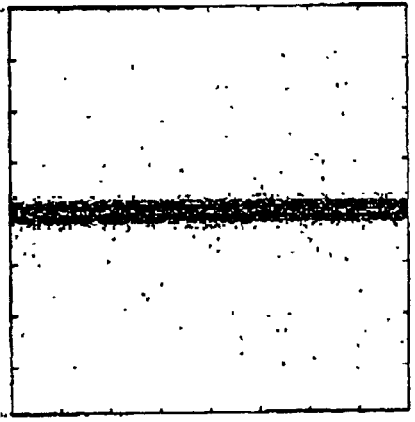
FIG. 11D
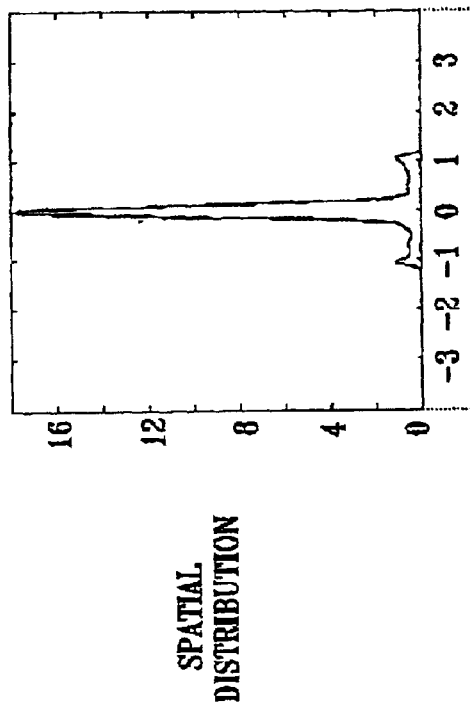
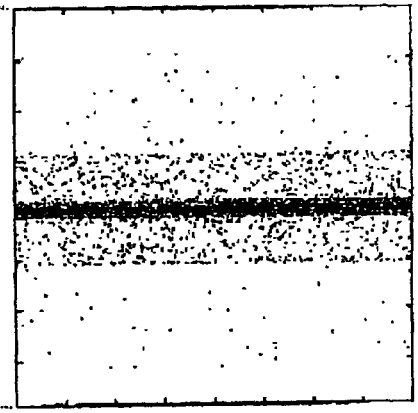
SPATIAL DISTRIBUTION
POSITION Y
POSITION X

NANO-LITHOGRAPHY USING SQUEEZED ATOMIC AND MOLECULAR STATES

FIELD OF THE INVENTION

The present invention relates to the field of the nanodeposition of atoms or molecules by means of squeezed atomic or molecular states generated by systems of standing light waves, especially for nano-lithographic applications.

BACKGROUND OF THE INVENTION

Conventional industrial optical lithography methods are approaching a fundamental limit at a resolution of the order of 70 nm, due to the non-availability of convenient light sources with wavelengths of less than 0.13 µm, the shortest wavelength excimer laser beams. Experimentation in the use of X-rays as an "optical" source with wavelengths below this level has been carried out for many years, but the technology is complex, expensive and difficult to work with, and commercial application does not yet seem viable. Since 100 nm resolution or less is expected to be in use in chip production in the near future, alternative approaches to nanofabrication have been examined in recent years. Techniques such as electron beam and ion beam lithography, which have higher resolution because of their short de Broglie wavelengths, though also in their infancy, are already commercially available. However, these methods too have the disadvantages that they are technologically complex and expensive to perform, and that because of the high energy of the beams, special techniques must be adopted to avoid damage to the surface material, and charging of the surface which could affect the pattern being generated.

One of the most promising schemes currently being developed, uses the methodology of atom optics, in which beams of neutral atomic particles are manipulated and focused by the lensing effect of interfering laser fields, and thus directly deposited onto a substrate, to form extraordinarily small features. Currently this technique is able to generate details of down to several tens of nanometers. The technique was originally developed by a joint group from AT&T Bell Laboratories and Harvard University, as described in their first publication on the subject in an article entitled "Using Light as a Lens for Submicron, Neutral Atom Lithography" by G. Timp et al., published in Physical Review Letters, Vol. 69, pp.1630–1639, 1992, and concurrently by researchers from NIST, as described in U.S. Pat. No. 5,360,764, for "Method of fabricating laser controlled nanolithography" to R. J. Celotta et al. Both of these documents are herewith incorporated by reference, each in its entirety. As an alternative to direct writing, the atoms have been used to expose a resist, even by focused neutral atoms at thermal energies. The energy for the resist modification comes from the internal energy of excited atoms, as described in U.S. Pat. No. 5,851,725 for "Exposure of lithographic resists by metastable rare gas atoms" to J. McClelland.

Atomic deposition techniques using light beams for focusing the atomic beam have several advantages over the currently available non-optical high-resolution techniques mentioned above, such as electron beam and ion beam lithography. It does not damage the deposition surface, it avoids charging the surface since slow neutral atoms are used, there are no limits set by charged-particle interactions in the beam itself, and contamination of the samples is prevented in the resist-free, direct deposition mode.

Theoretically, the resolution is limited only by the quantum mechanical deBroglie wavelength of a beam of thermal atoms which is typically about 10 pm. This is smaller than the spacing between atoms, such that it should theoretically be possible to grow structures as small as a single atom. Currently, a number of academic and technological laboratories worldwide are active in developing this technology.

However, the currently developed laser-focused deposition methods suffer from a major disadvantage in that there exists a considerable level of background deposition which limits the sharpness of the nanostructures deposited, and causes overlap between written features. In addition to the well-known phenomenon of surface migration of deposited atoms, there are two main reasons for this background. Firstly, the sinusoidal standing light wave accurately focuses the atomic beam only for atoms passing near the minimum of the light-induced potential, where its profile is parabolic. In this respect, a sinusoidal standing wave behaves like a conventional optical lens with a considerable level of aberrations, in particular, "spherical" aberration. The solutions known for correcting such aberrations in conventional optical elements, such as the use of aspheric or free-form surfaces, cannot be easily applied in the case of atom optics. In order to improve the quality of the focusing by means of a reduction of the background level, a combination of a standing light wave with a nano-fabricated mechanical mask with multiple slits has been suggested by S. Meneghini, et al., in an article entitled "Atomic focusing and near field imaging: A combination for producing small-period nanostructures", published in Applied Physics B, Vol. 70, pp. 675–682 (2000). The slit structure blocks the atoms passing far from the potential minimums. However, this complicates the set-up considerably, it being difficult to line up the slits and field nodes with sufficient mechanical accuracy, and significantly limits the deposition rate, since only those atoms passing through the slits are available for the deposition process.

Secondly, because of the longitudinal velocity spread of the incident atomic beam the atom lens suffers from an effect which is the equivalent of chromatic aberration in conventional optics. In general, thermal atomic beams have significant transverse and longitudinal velocity spreads. This can be reduced by techniques such as laser cooling and mechanical collimation. However, these techniques still cannot produce ideally monochromatic beams, so that the focus is still degraded because of this effort.

There therefore exists an important need for a method and apparatus for performing atomic and molecular beam focusing and deposition, which overcome the disadvantages and drawbacks of previous methods and apparatus.

The disclosures of all publications mentioned in this section and in the other sections of the specification, are hereby incorporated by reference, each in its entirety.

SUMMARY OF THE INVENTION

The present invention seeks to provide a new method and apparatus for performing atomic or molecular nano-deposition by means of atomic or molecular focusing through a plurality of optical standing waves. A stacked set of standing light waves, specially arranged in a predetermined form, and each standing wave preferably having a predetermined intensity, is used to compress or squeeze the width of the incident atomic or molecular beam into ultra-narrow, spatially localized spots or lines. In contrast to the linear focusing approach used in the prior art methods described above, the spatial compression or squeezing process takes place in a non-linear regime, and is not subject to the aberrations mentioned above. As a result, much tighter squeezing can be achieved than the focusing of prior art methods. Practically speaking, after a certain degree of compression or squeezing is achieved, the resolution becomes limited by other factors, such as beam quality and surface migration of the deposited atoms or molecules.

In order to distinguish the focusing effects of the present invention, from those of the prior art, an attempt has been made to use the term "focusing" hereinafter generally to describe prior art effects, whereas the terms "squeezing" or "compressing" are generally used hereinafter to describe the effects of the present invention. This delineation is not always possible, since the "focusing" effects of a single standing wave needs to be described sometimes in explaining the operation of the present invention, and the term focusing is also therefore sometimes used in this context. Furthermore, in claiming the present invention, the term focusing is used in its generally accepted meaning, even to claim the effects of the present invention, so that the claims are more readily understood.

Furthermore, although the non-linear spatial squeezing process of the present invention operates equally on atomic species, on molecular species, or even on molecular clusters, in order to simplify the nomenclature used in the present application, in the remainder of the specification, the invention is sometimes presented and claimed in terms of the generic term "atomic species" or "particles", even though it is to be understood that these terms are meant to include atoms, molecules or molecular clusters.

The use of atomic squeezing according to preferred embodiments of the present invention, essentially solves the problem of "spherical" aberrations arising from the sinusoidal form of the standing wave field, and reduces the negative effect of the lateral velocity spread of the incident beam. Furthermore, the use of atomic squeezing according to preferred embodiments of the present invention, after an optimization process, also reduces chromatic aberrations caused by longitudinal velocity spread in the incident atomic beam.

According to a preferred embodiment of the present invention, a plurality of electromagnetic standing waves are arranged in a serially stacked fashion. In the path of an incident atomic or molecular beam, the standing waves being aligned with their planes parallel, and laterally across the beam path. The standing waves are preferably sinusoidal in form, such as would be formed by interference of a propagating laser beam with a similar beam propagating in the opposite direction or at some angle to the first beam, or by interference of a propagating laser beam with the same beam counter-propagating in the opposite direction after retro-reflection. All of the standing waves are arranged to have the same period, or distance between nodes, which is called hereinafter, by analogy with optics nomenclature, the grating spacing. The nodes of each standing wave are aligned co-linearly, such that a stack of aligned grating arrays are formed in the path of the incident atomic beam. The direction in the plane of the standing wave and perpendicular to the direction of its nodes, or, expressed alternatively, perpendicular to the lines of the grating, is termed in this application, the "direction" of the standing wave, and it is essentially parallel to the directions of propagation of the waves whose interference produces the standing wave. The term "grating" is optionally used in this specification, to describe the structure of the standing waves described in various preferred embodiments of the present invention.

The effect of the stack of standing wave gratings, when arranged in the correct predetermined manner, as described in the preferred embodiments of the present invention, can be shown mathematically to be cumulative, each successive standing wave adding its own compression or squeezing effect to the beam incident upon it, on top of the squeezing effect of the previous standing wave. The first standing wave provides an initial focusing effect to the incident beam, as is known in the prior art. The second standing wave is arranged at a predetermined distance from the first, such that the atomic species of the initially squeezed beam undergo further squeezing as the result of interaction with the second standing wave. The second standing wave is arranged to be located at what would be called the "circle of least confusion" according to the analogy of optical nomenclature. The following standing wave gratings are similarly arranged at predetermined positions such that the squeezing effect is constructively compounded, thus further focusing the beam, until it impacts the substrate. This too has to be located at a predetermined position in order that the focusing effect of the complete stack be applied correctly. The result is a series of deposited lines of atoms or molecules aligned perpendicular to the direction of the stack of standing waves, and collinearly with the nodes of the stack of standing waves.

According to preferred embodiments of the present invention, the mutual disposition of the standing waves with respect to each other and with respect to the substrate, their node spacing, and their intensities are calculated to provide, from the incident beam, the desired deposition pattern with the desired detail resolution. According to further preferred embodiments of the present invention, the standing waves are arranged such that the ensuing focusing effect has minimal dependence on the longitudinal thermal velocity spread in the incident atomic beam. The effect of chromatic aberrations is thus significantly reduced to a low level. With regard to the transverse velocity spread, there are known procedures to reduce it to acceptable levels, such as by means of mechanical collimation and laser cooling. However, if the standing waves are correctly optimized, according to preferred methods of the present invention, the effects of any residual transverse velocity distribution in the incident beam are significantly reduced, such that the deposited pattern of atoms or molecules has a sharp profile, and the background deposition present in prior art methods is greatly reduced.

The above-described arrangements of stacks of parallely aligned standing waves results in a series of parallel lines of deposited atomic species. If an additional standing electromagnetic wave is disposed in the beam path, with the direction of the standing wave aligned orthogonally to the direction of the stacks of parallely aligned standing waves, then each of the lines of the squeezed beams of atomic species is also focused in the direction perpendicular to the deposited lines, by this additional standing wave, and the result is a two dimensional array of spots, whose rows are perpendicular to the direction of the stack of standing waves and the direction of the additional standing wave. If the additional standing wave is at an angle other than 90° to the stack direction, then the array of deposited spots will be skewed accordingly.

The above-described preferred embodiment uses a single additional standing wave to focus the lines of atoms into an array of spots. According to another preferred embodiment of the present invention, instead of a single standing wave arranged at an angle to the first stack of standing waves, a second stack of standing waves may preferably be used, aligned at an angle to the first stack, and preferably interspersed with the first stack along the beam path. The result is then an additional squeezing effect in the direction of the second stack, and the array of spots of atoms deposited are squeezed down also in the second direction, with the incumbent advantages of the methods of the present invention. As a result, an array of spots is obtained more finely defined in both directions. According to other preferred embodiments of the present invention, the angled arrays may be more conveniently aligned along the beam path such that each layer of the stack of standing waves consists of a pair of coplanar standing waves, each having the correct parameters, arranged at the desired angle to each other, usually a right angle, such as to provide the desired array of deposited spots. According to even more preferred embodiments of the present invention, the angled arrays may be aligned orthogonally to each other, such that the array of deposited spots is a rectangular array.

According to other preferred embodiments of the present invention, if only part of the array of spots is required, a plate having an aperture in the position of the desired spot or spots may be interposed in the beam path, to select that spot or those spots whose deposition is desired.

Theoretical calculations of the squeezing effect according to the present invention, show that practically unlimited squeezing may be achieved if a large enough number of standing waves is used. However, a large number of standing waves would be practically difficult to arrange and manage. According to a preferred embodiment of the present invention, a method is provided of producing an adequate squeezing effect by the use of a small number of optimized standing waves, suitably disposed at predetermined distances from each other, and wherein, each standing wave may generally have a different predetermined intensity in comparison to the others in the stack.

The preferred methods of the present invention may be utilized to construct systems for nano-deposition of particles, for use in any of the known applications of such atomic or molecular depositions, and for any new applications devised. The advantages of the present invention over the prior art, including higher resolution and less background deposition, are thus carried over to such systems. Such applications include, but are not limited to direct writing lithography, the direct construction of nano-structures, such as optical gratings and structures of electronic circuits, the preparation of masks for further lithographic processing of the substrate, and the doping of the substrates by selective implantation of the atoms or molecules into the substrate.

There is thus provided in accordance with a preferred embodiment of the present invention, a method for focusing an atomic or molecular beam, comprising the steps of forming a collimated beam of the atomic species with reduced lateral and longitudinal velocity spread, providing a first plurality of electromagnetic standing waves of essentially identical spatial period and having their planes parallel to each other, arranged serially across the path of the beam at predetermined distances from each other, the standing waves being aligned laterally such that their nodes are collinear, and directing the collimated beam through the standing waves.

In accordance with yet another preferred embodiment of the present invention, the method described above may also include the step of disposing a substrate at a predetermined location relative to the plurality of standing waves, such that the particles of the incident beam are deposited onto the substrate. Furthermore, the electromagnetic standing waves may have essentially the same intensity, or different intensities. The plurality may preferably comprise two, three, four or more electromagnetic standing waves.

In accordance with still another preferred embodiment of the present invention, in the method as described above, at least one of the electromagnetic standing waves may preferably be generated by interference between two laser beams, or even more. Furthermore, the standing waves may be conveniently aligned laterally by adjusting the mutual phases of the laser beams whose interference generates the standing waves.

There is further provided in accordance with still another preferred embodiment of the present invention, a method for focusing a beam of atomic species as described above, wherein the intensities of the standing waves and their locations are determined by optimization either of the focusing effect itself, or of the deposition of the atomic species on the substrate.

In accordance with yet another preferred embodiment of the present invention, there is also provided a method for focusing a beam as described above, and also including the steps of providing at least one additional electromagnetic standing wave, having its plane parallel to the planes of the plurality of parallel electromagnetic standing waves, and aligning the at least one additional electromagnetic standing wave at an angle to the first plurality of electromagnetic standing waves, such that the beam is focused in a two dimensional array. The at least one additional electromagnetic standing wave may be co-planar with at least one of the electromagnetic waves of the first plurality of electromagnetic standing waves.

There is even further provided in accordance with another preferred embodiment of the present invention, a method for focusing a beam as described above, and also including the steps of providing at least a second plurality of parallel electromagnetic standing waves of an essentially identical spatial period, and having their planes parallel to the planes of the first plurality of parallel electromagnetic standing waves, the second plurality of standing waves also being arranged serially across the path of the beam at predetermined distances from each other, and aligned laterally such that their nodes are collinear, and aligning the second plurality of electromagnetic standing waves at an angle to the first plurality of electromagnetic standing waves, such that the beam is focused in a two dimensional array. At least one of the electromagnetic standing waves of the first plurality of electromagnetic standing waves may preferably be co-planar with at least one electromagnetic standing wave of the second plurality of electromagnetic standing waves. Furthermore, the at least one additional electromagnetic wave and the first plurality of parallel electromagnetic standing waves, as described above, may preferably be essentially orthogonal. Similarly, the first and the second pluralities of parallel electromagnetic standing waves described above, may be essentially orthogonal.

In addition, in the methods for focusing an atomic or molecular beam as described above, the spatial periods of the at least one additional electromagnetic standing wave and of the first plurality of parallel electromagnetic standing waves may be essentially the same, and likewise, the spatial periods of the first plurality and the second plurality of parallel electromagnetic standing waves may be the same.

There is also provided in accordance with a further preferred embodiment of the present invention, the method as described above and also including the step of arranging the predetermined distances between the electromagnetic standing waves such that each serially successive electromagnetic standing wave down the beam path is located at the position of minimal beam width resulting from the traverse of the beam through the previous standing wave of the plurality of standing waves.

Furthermore, in accordance with a further preferred embodiment of the present invention, the substrate may be moved relative to the plurality of standing waves, either by movement of the substrate itself, or by movement of the plurality of standing waves. The movement of at least one of the plurality of standing waves may preferably be performed by adjusting the mutual phases of the laser beams whose interference generates the standing wave.

In any of the methods described above, the effects of transverse velocity distribution of the beam are reduced such that the atoms or molecules are deposited on the substrate in sharp-edged patterns and having a reduced background of deposited particles between the patterns. Furthermore, by performing optimization, the effects of longitudinal velocity distribution of the beam can also be reduced such that the particles are deposited on the substrate in sharp-edged patterns and having a reduced background of deposited particles between the patterns.

Furthermore, in any of the methods described above, a plate having at least one aperture may preferably be disposed in the path of the atomic beam. The dimension of the at least one aperture may preferably be smaller than the minimal spatial period of the plurality of standing waves, such that the beam is focused to a single pile of atoms or molecules, or is deposited essentially as a single pile of atoms or molecules. Alternatively and preferably, the dimension of the at least one aperture may be larger than at least two spatial periods of the plurality of standing waves, such that the beam is deposited essentially as a plurality of piles of atoms or molecules.

There is also provided in accordance with a further preferred embodiment of the present invention, a system for performing atomic or molecular deposition, the system including a source emitting respectively an atomic or molecular beam, a first plurality of electromagnetic standing waves of essentially identical spatial period and having their planes parallel to each other, arranged serially across the path of the beam at predetermined distances from each other, the standing waves being aligned laterally such that their nodes are collinear, and a substrate disposed at a predetermined location after the last of the plurality of standing waves, such that the particles of the beam are deposited onto the substrate. At least one of the electromagnetic standing waves may preferably be generated by interference between laser beams. Furthermore, in the system as described above, the atoms or molecules may preferably be deposited in a set of parallel lines having a first spacing. Mutual movement of the substrate relative to the plurality of standing waves may be performed, such that the atoms or molecules are deposited in a set of lines having a spacing closer than that of the first spacing.

Furthermore, in accordance with yet another preferred embodiment of the present invention, there is provided a system for performing deposition of atomic species, as described above, and also including at least one additional electromagnetic standing wave having its plane parallel to the planes of the first plurality of parallel electromagnetic standing waves, and aligned at an angle to the first plurality of electromagnetic standing waves, such that the atomic species are deposited in a two dimensional array. Mutual movement of the substrate relative to the first plurality of standing waves may preferably be performed, so that the atomic species are deposited in a two dimensional pattern. Furthermore, the at least one additional electromagnetic standing wave may preferably be a second plurality of electromagnetic standing waves aligned at an angle to the first plurality of electromagnetic standing waves, such that the atomic species are deposited in a two dimensional array having a first spatial density. Mutual movement of the substrate relative to at least one of the plurality of standing waves may preferably be performed, such that the atomic species are deposited in a two dimensional array of spatial density greater than the first spatial density.

There is also provided in accordance with yet further preferred embodiments of the present invention, systems for performing atomic or molecular deposition, as described above, and wherein the atoms or molecules form a mask pattern or an optical grating on the substrate, or a doped region within the substrate.

BRIEF DESCRIPTION OF THE DRAWINGS

The present invention will be understood and appreciated more fully from the following detailed description, taken in conjunction with the drawings in which:

FIGS. 3A to 3C show the spatial distributions at different propagation times after the atomic beam has experienced the $\delta$ kick;

FIGS. 5A and 5B show graphic representations of the spatial distributions of particles resulting from two different initial transverse velocity distributions, at a specific focal time, using a system such as that shown in FIG. 1;

FIGS. 8A to 8E show the calculated spatial distributions of the ensemble of particles squeezed using a system such as that of FIG. 6, after different numbers of kicks ranging, from 1 kick in FIG. 8A to 100 in FIG. 8E;

FIGS. 9A and 9B show the spatial distributions achieved after two different propagation times, in an atomic species squeezing system such as that shown in FIG. 6, using only two standing wave gratings, after the system has been optimized for best deposition performance;

FIGS. 10A to 10C illustrate results, similar to those of FIGS. 9A to 9B, but using an optimized sequence of three standing waves, and at three different propagation times;

FIGS. 11A to 11D illustrate results, similar to those of FIGS. 9A to 9B, but using an optimized sequence of four standing waves, and at four different propagation times;

DETAILED DESCRIPTION OF PREFERRED EMBODIMENTS

Figure 1:
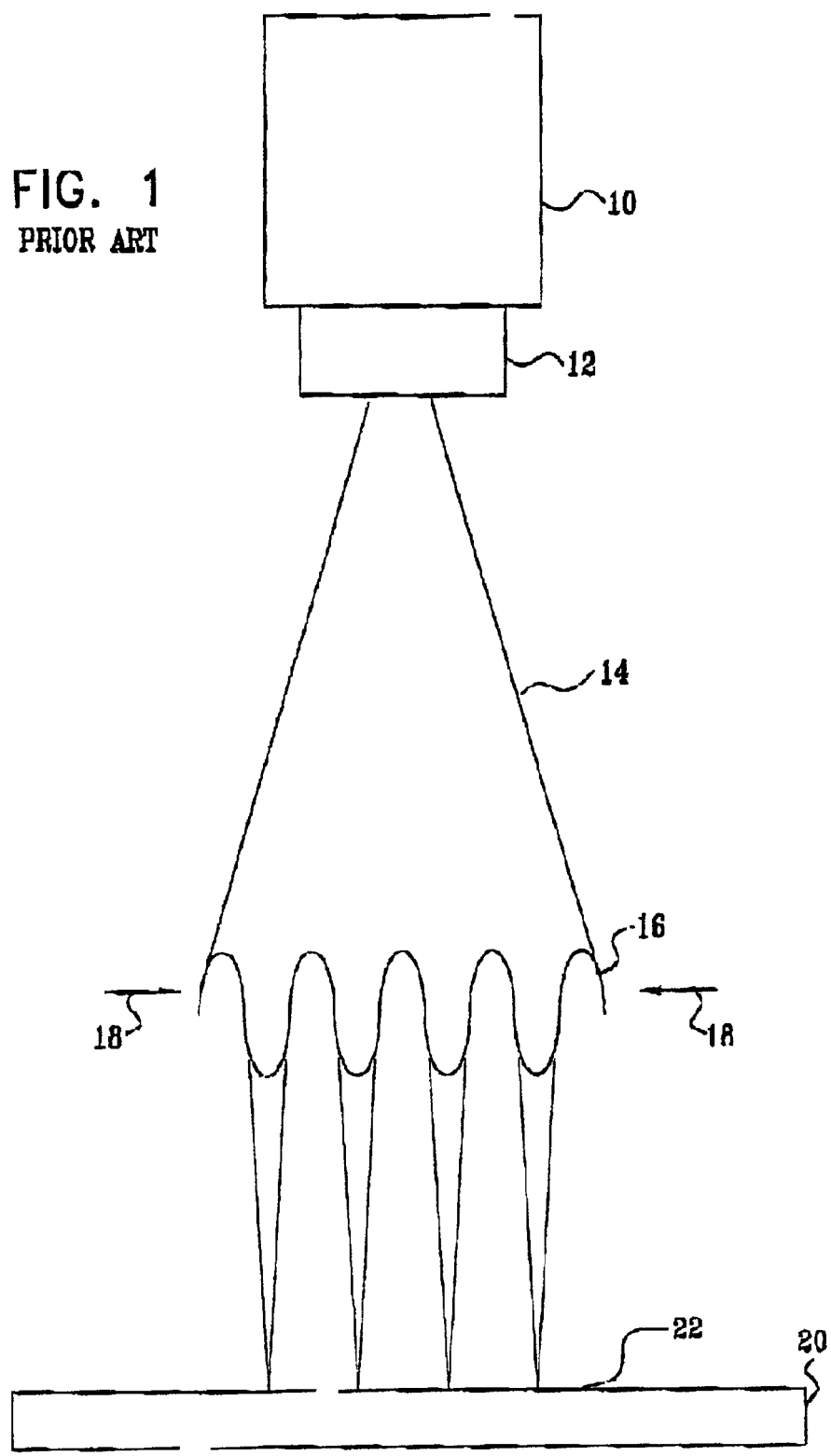
FIG. 1 illustrates schematically an experimental arrangement for performing linear focusing and deposition of a thermal atomic beam, as is known in the art.

Reference is now made to FIG. 1, which illustrates schematically an experimental arrangement for performing linear focusing and deposition of a thermal atomic beam, as is known in the art. A beam of thermal atoms is emitted from an atomic furnace 10, at whose exit there is preferably located a mechanical beam collimator 12 for limiting the transverse velocity spread of the beam. According to prior art applications of atomic beam focusing, a stage of laser cooling, not shown in FIG. 1, is also typically required in order to reduce the spread of velocities in the beam. The collimated beam 14 is incident on a single standing wave of electromagnetic waves 16, preferentially produced by two counter-propagating pulsed laser beams 18. The focusing effect of this standing wave results in the deposition of the atomic beam onto the substrate 20, with a concentration of the deposits at the focal spots 22 located beneath the nodes of the standing wave.

The interaction of a propagating atomic beam with a spatially localized CW standing electromagnetic wave, can be analyzed by considering a system of cold atoms which are confined in a trap and interact with a pulsed standing wave of light. As the beam crosses the grating, the atoms of the beam experience a pulse of field, which injects an impulse of momentum, known as a "kick", in a direction perpendicular to that of the atomic beam propagation. Such a system, using a single standing wave of light has been described in, for instance, the article entitled "Dynamic Localization of Ultracold Sodium Atoms" by C. F. Bharucha et al., published in Physical Review E, Vol. 60, pp. 3881–3895, 1999, and in the articles quoted therein. The atoms are assumed to be two-level atoms with transition frequency $\omega_0$. They interact with a standing wave of linearly polarized, monochromatic light of frequency $\omega_1$.

If the detuning $\Delta_1 = \omega_1 - \omega_0$ is large compared to the relaxation rate of the excited atomic state, the excited state population can be adiabatically eliminated, as shown by R. Graham et al, in the article entitled "Dynamic Localization of Atomic Beam Deflection by a Modulated Standing Light Wave" published in Physical Review A, Vol. 45, pp. R19–R22, 1992. In this case, the internal structure of the atoms can be neglected and the atoms can be regarded as point-like particles. In this approximation, the Hamiltonian for the center of mass motion of the atom is given by the expression:

$$H(x, p) = \frac{p^2}{2m} + V_0 \cos(2k_l x) \quad (1)$$

where p is the transverse momentum of the atoms, m is their atomic mass, $k_1 = \omega_1/c$ is the wave number of the standing wave, and $V_0$ is proportional to the laser intensity and atomic polarizability.

There are no principal differences between atoms and molecules as far as non-resonant interaction with the laser field is concerned. The only important characteristics of the atomic or molecular particle for this purpose is its non-resonant polarizability. The same calculation is therefore applicable to molecules, with $V_0$ being proportional in this case to the laser intensity and the molecular polarizability.

If the optical field is pulsed in time, the Hamiltonian becomes:

$$H(x, p, t) = \frac{p^2}{2m} + F(t)V_0\cos(2k_l x) \quad (2)$$

where F(t) describes the shape of the pulses acting on the beam. If the atomic beam passes through each of the gratings so fast that the atoms do not change their lateral position during interaction (the so-called thin-lens approximation), F(t) may be approximated by a series of δ-kicks at times $t_{vis}$ i.e. $F(t) = \Sigma_n \delta(t-t_n)$. This Hamiltonian corresponds to that of the δ-kicked rotor. In the limit of zero temperature, meaning that the initial transverse momentum of the atoms is p=0, the dynamics of the above-described system corresponds exactly to the dynamics of the kicked rotor. However, for finite temperatures, meaning an initial momentum distribution with finite width, the momentum, p, is a continuous variable and the dynamics of the system deviates from that of a kicked rotor.

In order to analyze the system, it is convenient to introduce scaled, dimensionless units, as for instance explained in the article entitled "Ballistic Peaks at Quantum Resonance" by W. H. Oskay et al, published in Optics Communications, pp. 137–148, Vol. 179, 2000.

It is convenient to consider, as a typical time scale, the so called revival time of the system, $\tau_r h/E_r$, where $E_r - h^2 - (2k_1)^2/2m$.

It is then convenient to define $t^1 = t/\tau_r$, $x^1 = 2k_1 x$, $p^1 = 2k_1 \tau_r p/m$ and the dimensionless Hamiltonian $H^1 = 4k_1^2 \tau_r^2 H/m$. The Hamiltonian given by equation (2) above can then be rewritten as:

$$H(x, p, t) = \frac{p^2}{2} + Kf(t)\cos x \quad (3)$$

where the primes have been dropped. The dimensionless field intensity is given by $K - 2\eta V_0 \tau_r^2/m\lambda_1^2$, where $\eta = \int_{-\infty}^{\infty} F(t)dt/\tau_r$. Finally, the shape of the pulses in scaled units is $f(t') = F(\tau_r t')/\eta$.

The similarity of the Hamiltonian of equation (2) or equation (3) with the case of the δ-kicked rotor suggests that approaches developed for solving the problem of orienting (aligning) a driven rotor can be applied to the system of cold atoms or molecules or molecular clusters interacting with a standing light wave.

Many aspects of the squeezing mechanism are of purely classical origin, so that a study of the behavior of the phenomenon can be performed by first investigating the dynamics of a classical ensemble of particles governed by the Hamiltonian given in equation (3). As a result of one δ-kick, the velocity of each particle changes according to:

$$v_i \to v_f - K \sin x_i \qquad (4)$$

Between these kicks, the particles move with constant velocity, and their positions change according to:

$$x_i \to x_i + v_f t \pmod{2\pi} \qquad (5)$$

In a classical system, the field strength K only determines the time scale of the dynamics. Therefore, a scaled time $\tau = Kt$ can be introduced. The scaled velocity is then $v^1{}_i = v_i K$, and equations (4) and (5) can be rewritten:

$$v^1{}_i \to v^1{}_i = \sin x_i$$

$$x_i \to x_i + v^1{}_i \tau \pmod{2\pi} \qquad (6)$$

Figure 2:
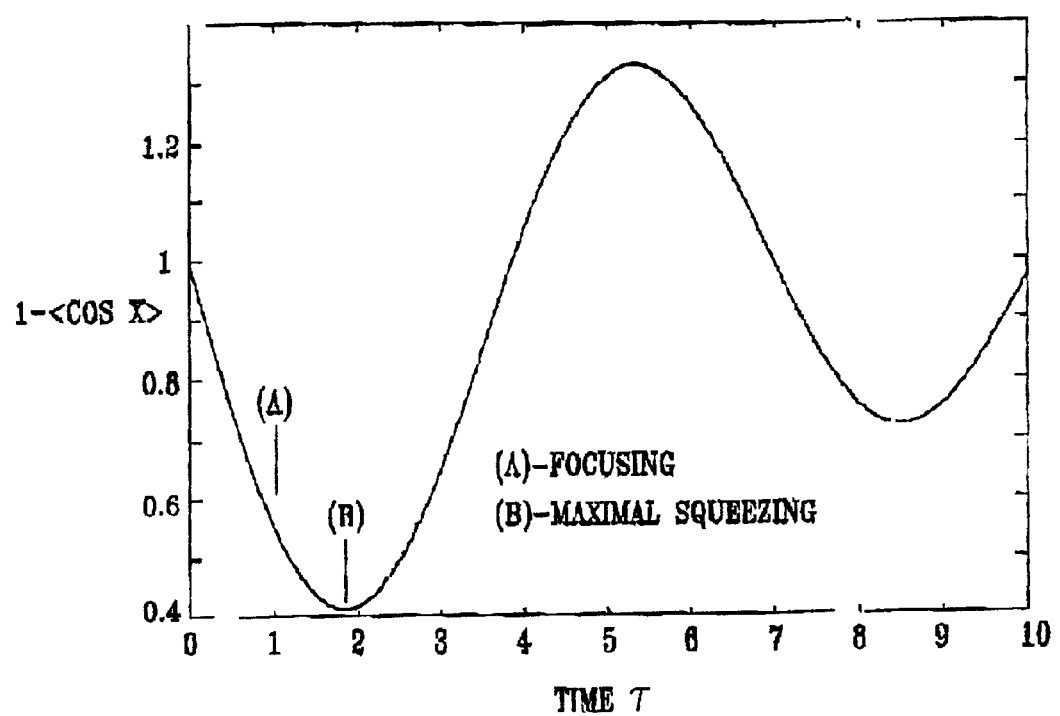
FIG. 2 is a graphical plot of the localization factor for a classical ensemble of particles, focused using a system such as that shown in FIG. 1, as a function of time $\tau$ after crossing a single optical standing wave.

Reference is now made to FIG. 2, which is a graphical plot of the localization factor $O(\tau) = <1-\cos x>$ for such a classical ensemble of particles, as a function of time $\tau$ after a single $\delta$-kick. This localization factor is a measure of the amount of squeezing or the width of the spatial distribution of the atomic species trapped in every period of the standing wave. For well squeezed distributions ($<x><<1$), the above localization factor is close to $\frac{1}{2}<x^2>$, i.e. one half of the distribution variance. It can be seen that maximal squeezing occurs some time after the focusing event occurring at time $\tau = \tau_f = 1$ in the notation used above. The maximal value of squeezing that can be obtained from a single $\delta$-kick corresponds to $O(\tau_{min}) = 0.41$ at a time $\tau_{min} = 1.85$.

Figure 3A:
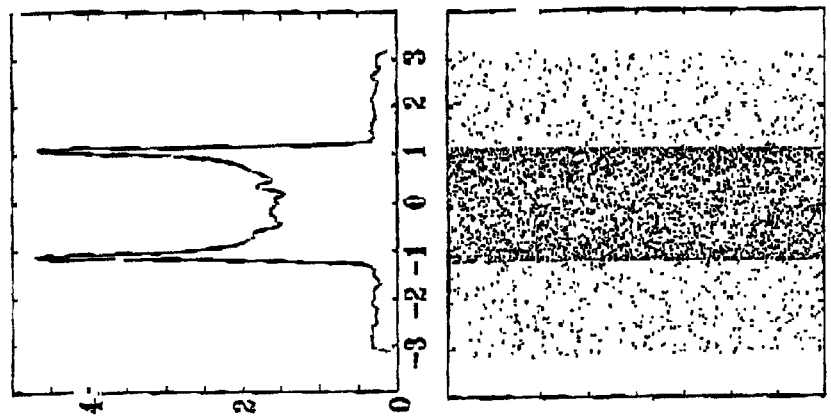
FIGS. 3A to 3C are plots showing the spatial distribution of particles perpendicular to a beam focused using a system such as that shown in FIG. 1, namely where one $\delta$-kick from a single standing wave has been imparted to the beam.
Figure 3B:
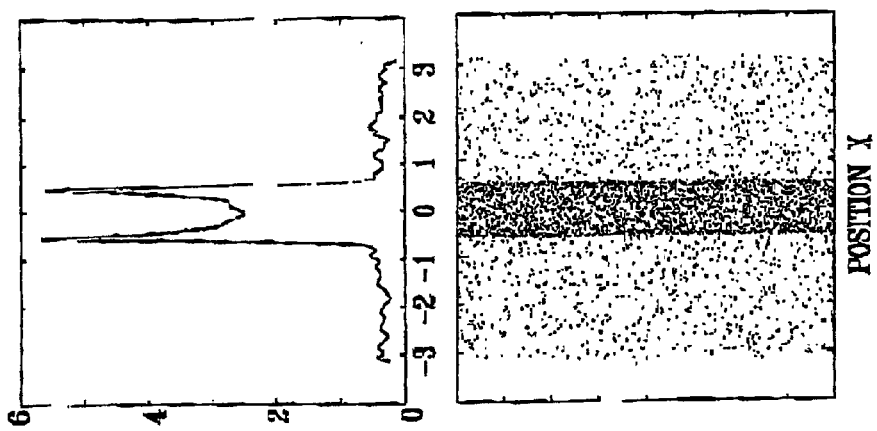
Figure 3C:
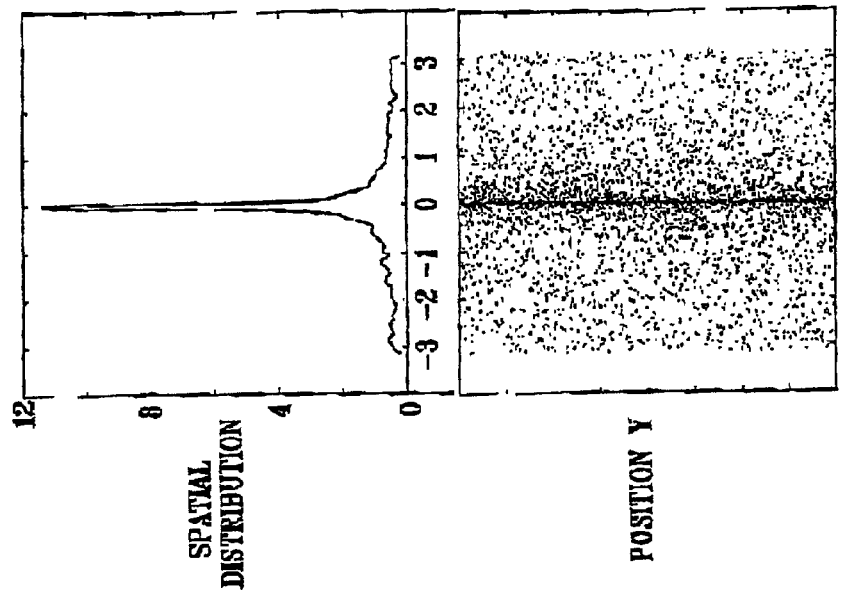

Reference is now made to FIGS. 3A to 3C which are plots showing the spatial distribution of particles perpendicular to a beam focused using a system of FIG. 1, namely a system in which one $\delta$-kick is imparted to the particles. The three figures show the spatial distributions at different times after the $\delta$-kick, for one spatial period of the standing wave. They are equivalent to the deposition patterns that would be obtained by insertion of a substrate into the focused beam path at distances corresponding to the transit times of the particles since the $\delta$-kick. The illustrations in the bottom row show results of a Monte-Carlo simulation for deposition of several tens of thousands of particles, while those in the top row present corresponding calculated distributions of deposited particle density. In comparing the results of the three cases, it should be noted that the intensity ordinate scale is not the same for the three graphs. For the purposes of the calculation, the initial distribution is taken as being uniform in space, and the initial transverse velocity is $v_i = 0$ for all particles.

FIG. 3A shows the spatial distribution at a time $\tau = \tau_f = 1$ after the kick. A sharp, narrow peak at $x=0$ is observed. This is the case generally used for prior art atomic lithography applications based on paraxial focusing. This location of the substrate is chosen because the beam would seem to be at its position of optimum focus. However, it is observed that this sharp narrow peak is situated on top of a broad and not insignificant background, and as previously mentioned, this is one of the side effects which makes the prior art applications of atomic beam focusing so disadvantageous. This feature is analogous to that of the aberrational effects observed in the focusing of light rays by an optical lens. The velocity of a particle at the position x is: $v(x) = -\sin x$. Therefore, particles with $x<<1$ have a velocity proportional to their position and arrive at the focal point $x=0$ at the same focus time $\tau_f = 1$. Expressed in this formalism, the finite width of the focal spot and the broad background deposition present is due to the effect of "spherical aberration" of the standing wave field, resulting from the deviations of the cos x potential from a true parabolic shape.

FIG. 3B shows the spatial distribution at a time $\tau = 1.85$ after the kick, while FIG. 3C shows the spatial distribution at a time $\tau = 2.5$ after the kick. The distribution after a time $\tau = 1.85$, as shown in FIG. 2, is that of maximum squeezing, i.e. of minimal value of distribution width. The position of this neck is at what would be called in the conventional optical analogy, the circle of least confusion. Beyond this position, as shown in FIG. 3C, the central "compressed" area spreads out considerably, though the background remains low.

Figure 4:
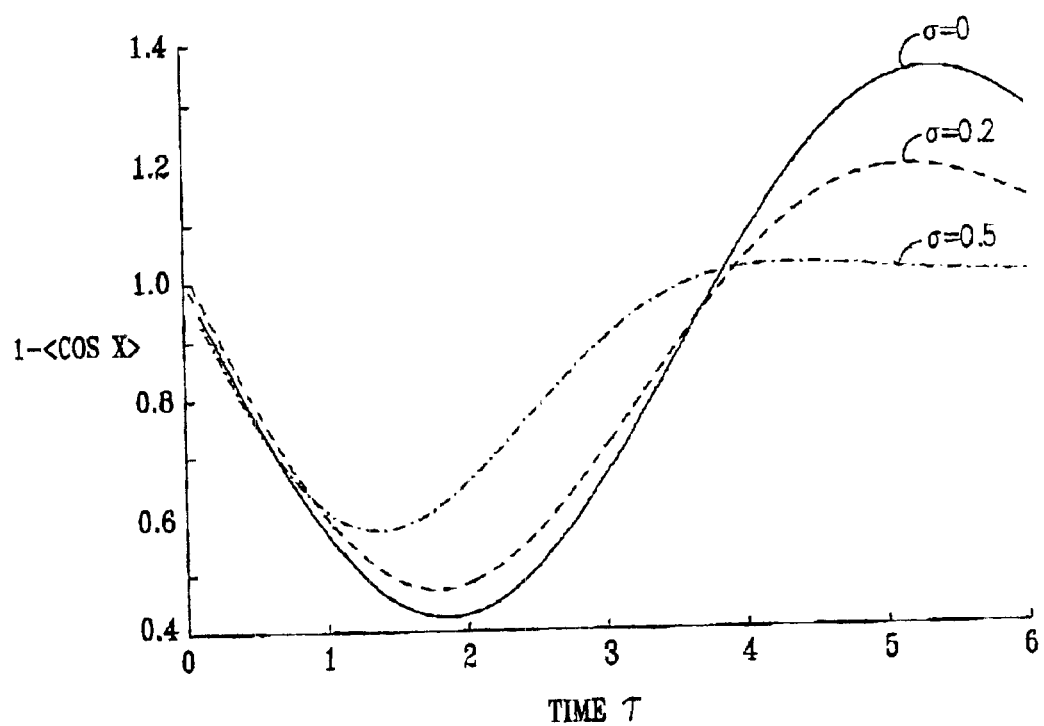
FIG. 4 is a plot of the localization factor of a classical ensemble of particles focused using the system of FIG. 1, for different values of the transversal velocity spread of the particles.

If the ensemble of particles has a finite temperature, the effects of focusing and squeezing becomes less well-defined, and the quality of focusing and the amount of squeezing is reduced. Reference is now made to FIGS. 4 and 5A–B, which graphically illustrate the effect of a non-zero initial transverse velocity distribution, calculated for the case of a single $\delta$-kick, as used in prior art applications of atomic beam paraxial focusing by means of an electromagnetic standing wave.

It is assumed in these calculations, based, for instance, on W. H. Oskay et al. in op. cir., that the initial transverse velocity distribution is Gaussian:

$$f(v', r = 0) \propto \exp\left(-\frac{v'^2}{2\sigma_v^2}\right) \qquad (7)$$

The temperature associated with the width $\sigma_v$ is then $T = K^2 \sigma_v^2 m/k$, where m is the mass of a particle and k is the Boltzmann factor. For an ensemble of cesium atoms, as discussed by W. H. Oskay et al., in op. cit., and for $K=1$, the temperature is $T=2.7°$ K for $\sigma = 0.2$ and $T=16.7°$ K for $v=0.5$.

FIG. 4 is a plot of the localization factor $<1-\cos x>$ of a classical ensemble for different temperatures. The solid line corresponds to a initial velocity distribution with a width $\sigma-0$, the dashed line to $\sigma=0.2$ and the dash-dotted line to $\sigma=0.5$.

FIGS. 5A and 5B are graphic representations of the spatial atomic density distributions at the focal time $t=t_f=1$, resulting from different initial velocity distributions. In FIG. 5A, the initial velocity distribution corresponds to a width $\sigma=0.2$, while in FIG. 5B, $\sigma=0.5$.

The deposition results shown in FIGS. 5A–5B should be compared with those shown in FIGS. 3A–3C, for zero initial velocity. As is observed, as the width of the velocity distribution increases, the deposition results degrade significantly. This is the reason why beam cooling and collimation are of such importance in prior art applications of atomic beam deposition using a single standing wave for focusing.

In order to enhance the amount of squeezing that can be achieved in atomic or molecular beam deposition, and thus to overcome disadvantages of prior art atomic lithography, according to a preferred embodiment of the present invention, multiple $\delta$-kicks in the transverse direction are applied to the beam as it propagates. The kicks result from interaction of the beam with a correctly arranged set of electromagnetic standing waves. According to this preferred embodiment, an initial kick is first applied, which results in an initial squeezing effect. When the system reaches the point of maximal squeezing, the next kick is applied, thereby squeezing the beam even more, and so on with additional kicks, each preferably being applied at the point of maximal squeezing of the previous kick.

Figure 6:
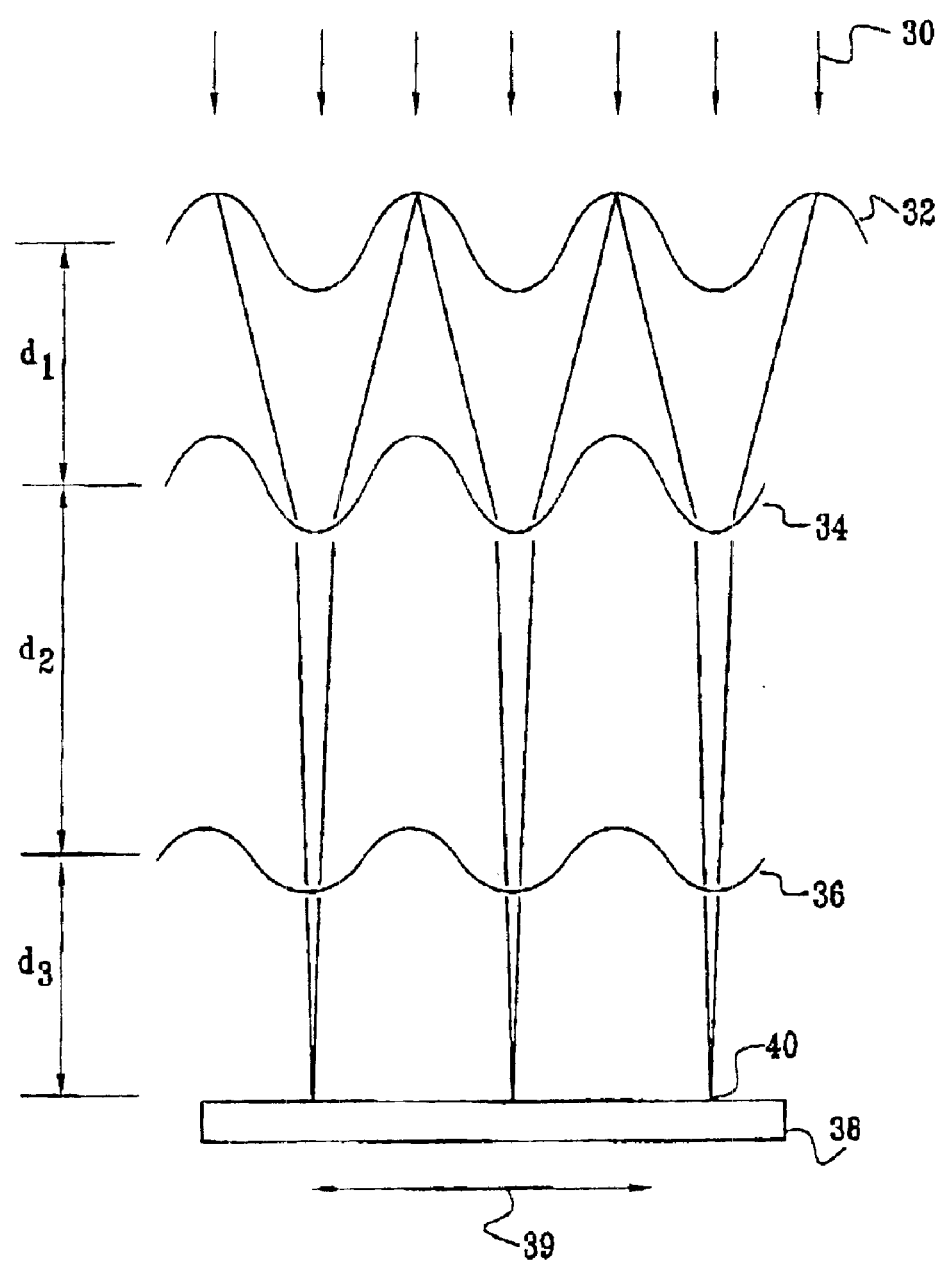
FIG. 6 is a schematic illustration of an experimental system, according to a preferred embodiment of the present invention, whereby multiple kicks can be applied to an atomic or molecular beam, by means of a plurality of standing electromagnetic waves disposed in the beam path, with their nodes arranged to be co-linear.

Reference is now made to FIG. 6, which is a schematic illustration of an experimental arrangement, according to a preferred embodiment of the present invention, whereby such multiple kicks can be applied to an atomic or molecular beam. The beam 30 is incident on a first standing wave grating 32, which applies the first kick to the beam and compresses it beneath the nodes of this standing wave. A second standing wave grating 34 is disposed at a distance $d_1$ beyond the first standing wave. This second standing wave grating 34 has the same period as the first standing wave. The second standing wave is aligned in the transverse or lateral direction such that its nodes fall essentially collinearly with the nodes of the first standing wave 32. Such an alignment is much simpler to perform than the mechanical alignment of masking slits as used in some prior art methods, since the positions of the nodes according to the present invention can be easily and controllably shifted on a nanoscale by adjustment of the phases of the laser beams interacting to produce the standing wave.

The distance $d_1$ is predetermined such that the compressed beam interacts with the second standing wave 34 just as it reaches its point of maximal squeezing. The second standing wave 34 then applies an additional level of squeezing to the beam, narrowing it even more. As previously explained, according to further preferred embodiments of the present invention, this second stage of squeezing does not diminish the squeezing achieved in the previous first stage, but applies an additional squeezing effect in the course of the further beam propagation. Further stages of squeezing can then be optionally and preferably applied to the squeezed beam, such as by a third standing wave 36, located at a distance $d_2$ from the second standing wave 34, this distance being arranged such that at the third standing wave 36, the beam just reaches its position of maximum squeezing from its interaction with the second standing wave 34. In the preferred embodiment shown in FIG. 6, three stages of squeezing are shown, and after the third stage, the beam is allowed to impact the substrate 38, disposed at a distance $d_3$ after the third standing wave 36. Here it deposits its particles in strongly localized spots 40, with minimal background deposition. It is to be understood, however, that any practical number of stages may be used, according to other preferred embodiments of the present invention.

Figure 7:
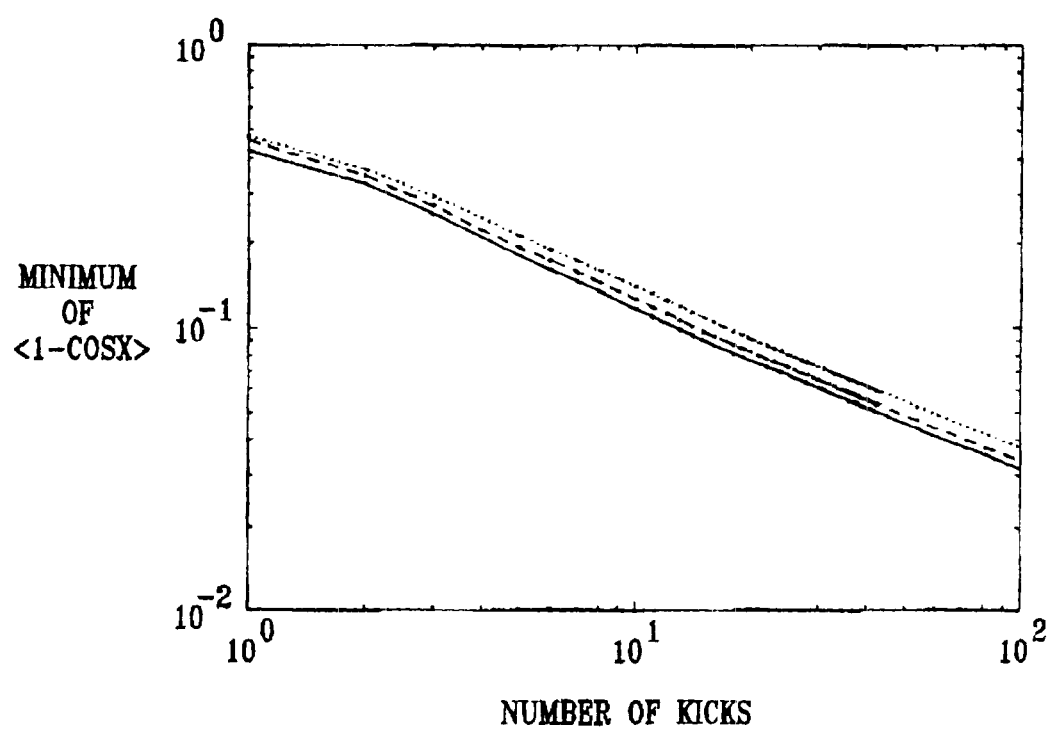
FIG. 7 is a graphical representation showing the amount of squeezing achieved using a system such as that shown in FIG. 6, constructed and operative according to a preferred embodiment of the present invention.

Reference is now made to FIG. 7, which is a graphical representation showing the calculated amount of squeezing achieved, expressed as the minimum value of the localization factor <1−cos x>, as a function of the number of identical kicks, for up to 100 kicks. The results are shown for a number of different temperatures, corresponding to different initial transverse velocity distributions. The solid line corresponds to an initial velocity distribution with $\sigma_v=0$, the dashed line to $\sigma_v=0.17$ and the dotted line to $\sigma_v=0.33$.

It is observed that, after about the second kick, the localization factor as a function of the number of kicks is a straight line on a double logarithmic plot, and shows no sign of saturation. The practical consequence of this result is that it should be possible to squeeze the ensemble of particles to any desired level, just by increasing the number of kicks, each kick representing another optical standing wave grating. Furthermore, it is observed that although, in the case of a finite initial velocity distribution width, following the first kick the system starts with a lower level of squeezing, the slope of all three straight lines in FIG. 7 is seen to be almost the same. This means that the effect of the initial distribution becomes proportionally less important with increase in the number of kicks. During each kick, the system gains kinetic energy in accordance with the kick strength, so that eventually, the initial thermal energy is small compared to the energy which the system gained during the kicks. This is the basis for the comparative insensitivity of the multiple kick method to initial transverse velocity spread, in contrast to the prior art methods using a single kick, whose focusing results are significantly more sensitive to the initial velocity spread of the incident atomic beam.

Reference is now made to FIGS. 8A to 8E which display the calculated spatial distribution of the ensemble of particles deposited after different numbers of kicks. FIG. 8A is shown for 1 kick, 8B for 5 kicks, 8C for 10, 8D for 50, and 8E for 100 kicks. The left hand column of the distributions corresponds to an initial velocity distribution with $\sigma_v=0$, while for the right hand column, the initial velocity distribution has $\sigma_v=0.5$. As previously noted, it is observed that for any given number of kicks, the squeezing effect degrades with increase in the initial velocity distribution. However, it is also observed that the degradation in squeezing is much less pronounced for the cases with higher numbers of kicks than for those with few kicks. As already stated above, the implication of this result is that according to the methods of the present invention, which use multiple kicks, the need for collimating the incident beam and reducing its transverse velocity spread, is less severe than in prior art methods which use only a single kick for focusing the beam.

The above described embodiments in principle allows the attainment of the desired level of squeezing simply by increasing the number of kicks, each being equivalent to an additional optical standing wave grating. Practically, the resolution becomes limited by other factors, such as beam quality and migration of the deposited atoms or molecules. However, the use of a large number of standing waves would involve construction of a complicated system and would involve a complex process to operate. According to a further preferred embodiment of the present invention, an optimized system for performing beam squeezing is proposed, having a smaller and hence more practical number of standing wave gratings.

Such a system is essentially similar to that shown in FIG. 6. However, whereas in the previous preferred embodiments, the location of each grating down the stack is chosen at the position where the spatial width of compressed atomic groups is a minimum as a result of the squeezing effect provided by the previous gratings in the stack, in this additional preferred embodiment, the optimized configuration is determined, using a small number of gratings, by maximizing the overall level of squeezing of the system as a whole. Preferably two, three, four or five gratings are used. If the interaction of the beam with the standing waves is described by δ-kicks (the thin lens approximation), the parameters available to optimize the squeezing process are the distances between the gratings (i.e. the time delays between the kicks), and the intensities of the gratings (the strength of each of the kicks). The results shown in the previous embodiments were obtained for fields of equal intensity, though the possibility of the use of fields with different strengths was mentioned. According to this further preferred embodiment of the present invention, the strength of each δ-kick is allowed to be different from that of the others, and the deposition process is optimized by varying not only the position of the separate standing waves and their distance from the substrate, but also their relative intensities, in order to achieve the best deposition parameters for the limited number of gratings. By its nature, this optimal configuration not only provides the maximum possible squeezing effect, but is also characterized by insensitivity to small variations of the optimization parameters. Such a solution is then robust to mechanical jitter in the apparatus, and reduces the sensitivity of the process to longitudinal velocity distribution of the incident beam, thus reducing the "chromatic aberration" of the system. It should be understood that different kinds of optimization may be performed under different possible constraints on the system. For instance, the intensities of the standing waves may be kept equal, and only their mutual displacements optimized. Alternatively and preferably, various restrictions on the standing waves intensities may be applied.

Reference is now made to FIGS. 9A and 9B which show the results of the spatial distribution achieved in an atomic or molecular beam squeezing system using only two kicks, coming from two gratings, after the system has been optimized in terms of the standing wave locations and intensities, for the best deposition performance. As in FIG. 2, the top row shows plots of the calculated deposited atomic density distribution, while the bottom row shows results of Monte-Carlo simulation of the particle density. It should be noted that the intensity ordinate scale is different for the two sets of graphs in FIGS. 9A and 9B. In the case of FIG. 9A, the distribution is shown in the plane of the second grating, separated from the first grating by a propagation time of $\tau=3.08$, and in the case of FIG. 9B, the distribution is shown slightly later, at the optimally determined time of maximal squeezing $t_{min}=\tau+0.15$, which determines the location of the substrate.

The initial condition is chosen to be $v_f=0$ for all particles. The maximal amount of squeezing that can be achieved by applying two $\delta$-kicks of optimized intensity, corresponds to an localization factor $O=0.15$. According to the embodiment whose results are described above in FIG. 7, wherein all of the $\delta$-kicks are constrained to be of equal intensity, the maximal amount of squeezing corresponds to a localization factor $O\approx0.3$ after two kicks. The use of optimized intensity kicks, according to the present preferred embodiment, is thus shown as improving the localization factor by a factor of 2. In contrast to the previous strategy, the second kick is not applied at the time of maximal squeezing. To achieve the optimum result, it is found necessary to wait until the distribution has again broadened somewhat after the point of maximum squeezing, and then to apply a second, strong kick. The result is found to be close to the optimum for a kick strength ratio of the order of 1:11.

Reference is now made to FIGS. 10A to 10C, which illustrate the results of the optimal sequence of three $\delta$-pulses (gratings). In this embodiment, the optimally achieved squeezing corresponds to a localization factor $O=0.04$. The spatial distribution corresponding to this squeezing is shown in FIG. 10C. As in the embodiment of two pulses (gratings) shown above, it can see from FIGS. 10A and 10B that the pulses which provide optimum squeezing should be applied at times when the distribution is rather broad, rather than at the time of maximal squeezing from the previous kick. The delay time between the second and third kick is found to be much shorter than the delay time between the first and the second kick. This is due to the fact that the average transverse velocity is much larger after the second kick. The delay times between the kicks for the results shown in FIGS. 10A–C are $\tau_1=3.6$ and $\tau_2=1.07$. The ratio between the kick strengths is found to be approximately 1:2:11. The spatial distributions in the graphs of FIGS. 10A–C are shown at times $t=\tau_1$ in FIG. 10A, at $t=\tau_1+\tau_2$ in FIG. 10B, and at the time of maximal squeezing $t_{min}=\tau_1+\tau_2+0.12$ in FIG. 10C. The substrate is preferably arranged such that the deposition occurs at this last point.

Reference is now made to FIGS. 11A to 11D, which illustrate the results of a further embodiment of the present invention, in which the optimization is performed for a sequence of four optimal pulses, arising from four standing wave gratings. In this embodiment, the maximal squeezing, as seen in FIG. 11D, corresponds to a localization factor $O=0.03$.

The results presented in FIGS. 11A–D correspond to delay times between the kicks of $\tau_1=3.1$, $\tau_2=1.3$ and $\tau_3=0.07$, and the optimized ratio between the kick strengths is approximately 1:2:13.5:20.5. The graphs show the spatial distribution at time $t-\tau_1$ in FIG. 11A, at time $t-\tau_1|\tau_2$ in FIG. 11B, at time $t=\tau_1+\tau_2+\tau_3$ in FIG. 11C, and at the time of maximal squeezing, $t_{min}=\tau_1+\tau_2+\tau_3|0.03$ in FIG. 11D.

Figure 12:
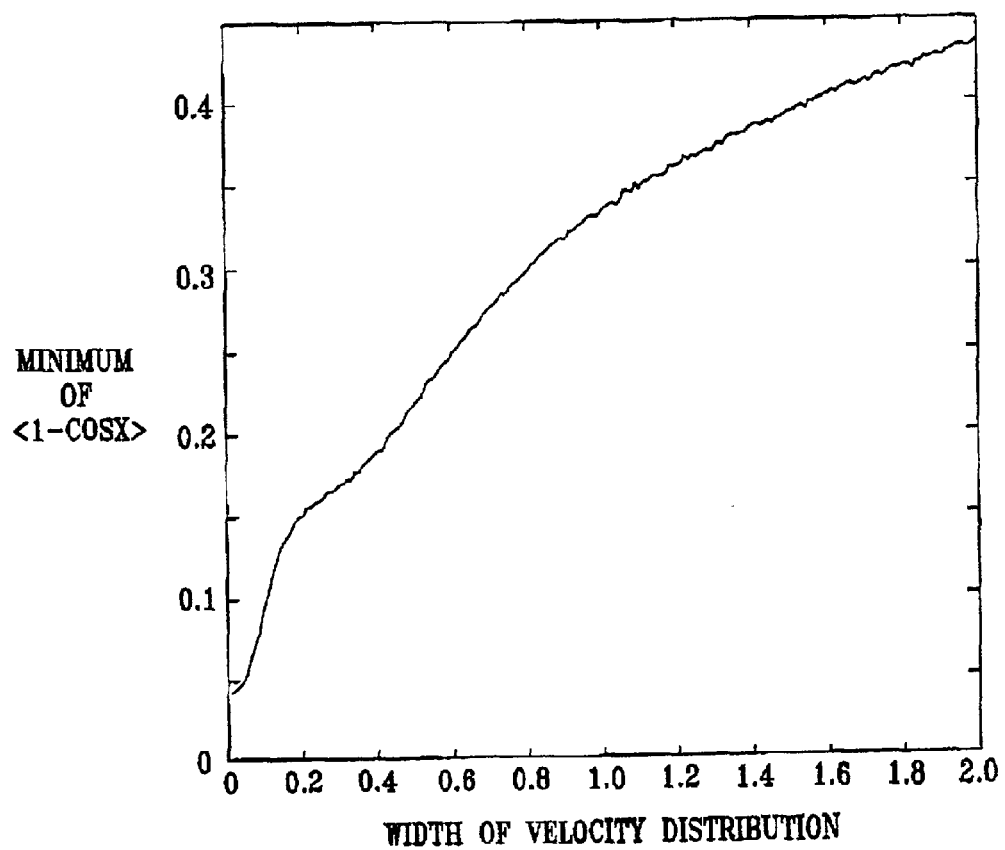
FIG. 12 is a graph showing the minimal localization factor as a function of the initial transverse velocity distribution of a beam of particles, after a series of three optimal standing waves, as shown in the embodiment of FIGS. 10A to 10C.

Reference is now made to FIG. 12, which is a graph showing the minimal localization factor O, as a function of the width per unit kick strength of the initial velocity distribution $\sigma_v$, after a series of three optimal pulses, as was shown in FIG. 10. Like the results shown in FIG. 10, for zero width of the initial velocity distribution, the minimal localization factor is $O=0.04$. The curve is averaged over 100 ensembles of particles, each ensemble containing 2000 particles. It can be seen, that the localization factor increases rapidly with growing width of the initial transverse velocity distribution. However, in comparison to the embodiment whose results are shown in FIG. 7, the optimized embodiment of FIG. 12 shows a reduced dependence on the initial transverse velocity distribution. Thus, it is observed that the value of the minimal localization factor for an initial velocity distribution of $\sigma_v=0.33$ is approximately 0.3 in FIG. 7, while for the same conditions with optimized kicks, it is only approximately 0.16. However, even these temperature effects can be suppressed by applying kicks with the same ratio as that calculated in the optimization for zero temperature, but with a larger total strength. It is clear, however, that according to either of the embodiments of the present invention incorporating multiple light gratings, the effects of transverse velocity spread and dispersion of the beam longitudinal velocity are substantially reduced compared with the prior art case of a single grating shown in FIG. 4, where for any initial velocity distribution, the minimal localization factor is much higher.

If a single set of parallel standing waves is used to perform atomic deposition according to the present invention, then the resulting structure is a set of deposited lines or strips, the spacing between them being determined by the spatial period of the standing wave pattern. If closer spacing of these lines is desired, then according to another preferred embodiment of the present invention, after deposition of a first set of lines, the substrate can be moved relative to the standing waves, and in the direction of the standing waves. This direction of motion is shown by the arrow 39 in FIG. 6. If the movement is made to be a fraction of the first line set spacing, then a second set of lines, and even more if desired, can be deposited between the lines of the first line set, thus providing a denser line spacing. The relative motion between the substrate and the standing waves can be performed wither by motion of the substrate, preferably by means of a micro-stage, or by motion of the standing waves. This later option is particularly preferred, since it can be accomplished by adjustment of the relative phases between the interfering waves which make up the standing waves. This can be accomplished electronically or electro-optically without the need for mechanical motion of any component of the system.

It two orthogonal sets of standing waves are utilized, then the beam is squeezed into a two dimensional array of localized spot structures. Motion of the substrate relative to the standing waves between depositions allows more closely packed arrays of spots to be obtained. The relative motion can preferably be by either of the methods described above in the case of one dimensional motion. Motion of the substrate relative to the standing waves while deposition is being performed allows the production of more complex structures, such as curved lines or other patterns.

Figure 13:
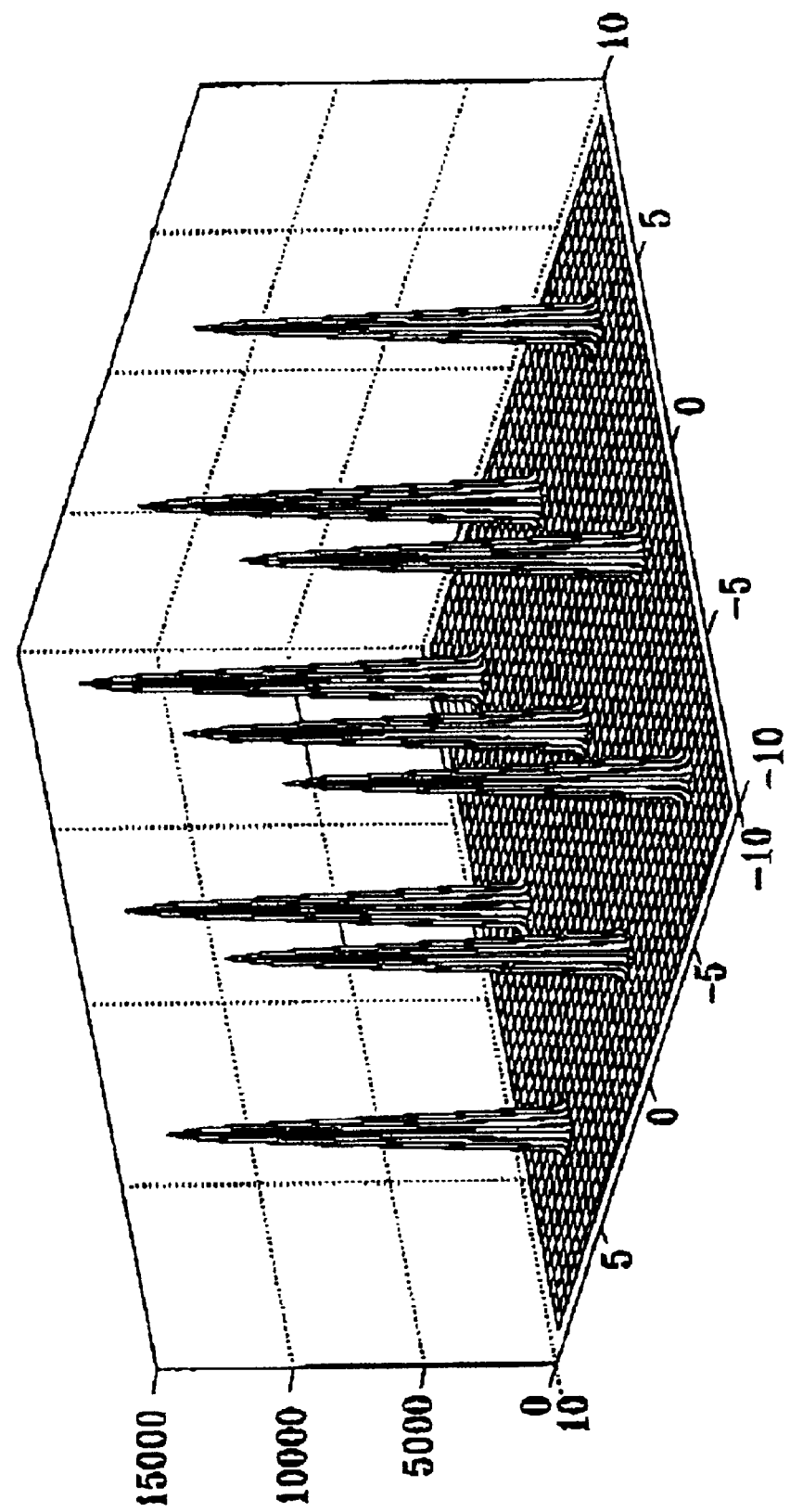
FIG. 13 is an example of a two dimensional array of dot structures, produced using a system constructed and operative according to a preferred embodiment of the present invention.
Figure 14:
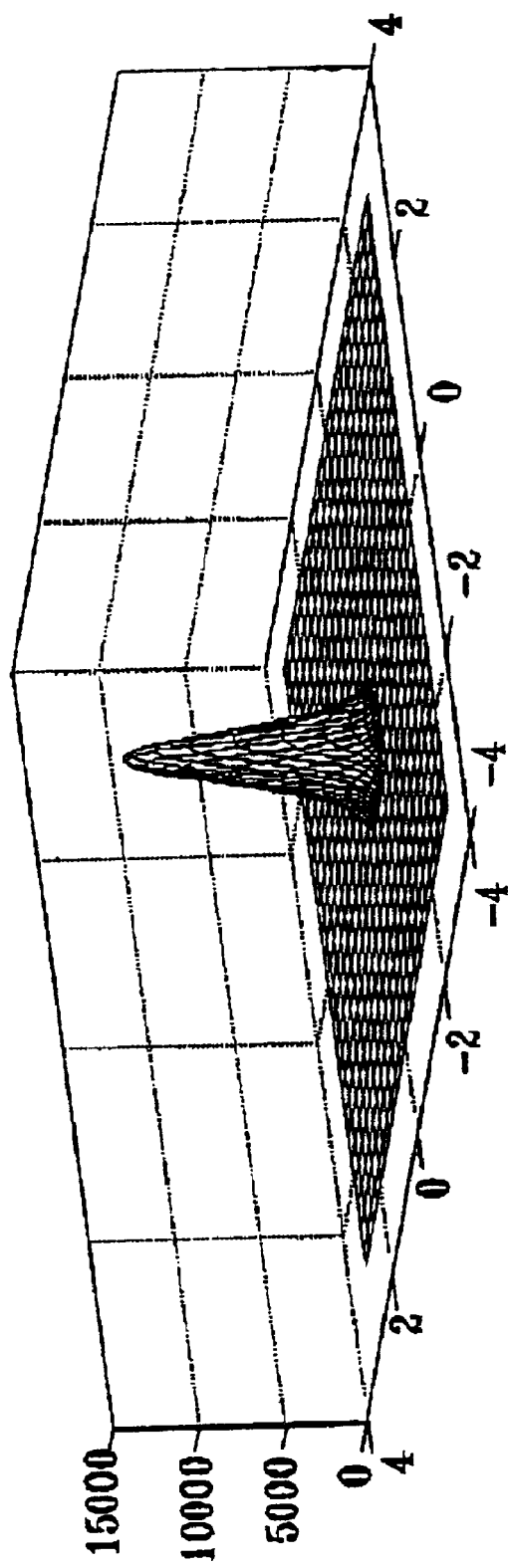
FIG. 14 shows a close-up view of a single spot feature of the deposited array shown in FIG. 13.

Reference is now made to FIG. 13, which is an example of a calculated two dimensional array of dot structures, according to a preferred method of the present invention, involving the use of two orthogonal sets of three standing wave patterns, optimized according to one of the above-mentioned preferred methods of the present invention. FIG. 14 shows a close-up view of a single spot-feature of the deposited array shown in FIG. 13. The use of a plate disposed in the beam path with one or more apertures, as is known in the art, enables the filtering out of a single or of a multiple selected number of deposited spots to be achieved.

Almost complete absence of any background deposition and a good separation of the deposited dots can be observed in FIGS. 13 and 14, these being features which distinguish the results obtained by the use of the techniques of the present invention. The spacing between the dots is dictated by the wavelength of the laser light and the conditions used to set up the standing waves. Several techniques are available to reduce the period of the structure to the size of the spot itself, such as the use of the atomic Talbot effect, or relative shift of the substrate and the optical gratings, to deposit another arrays of spots between those already deposited, as mentioned above. If a magnetic material, such as iron, is used for the deposition, the resulting dot structures may be used to provide a data storage medium with a density that is several orders of magnitude higher than currently available storage media.

Figure 15:
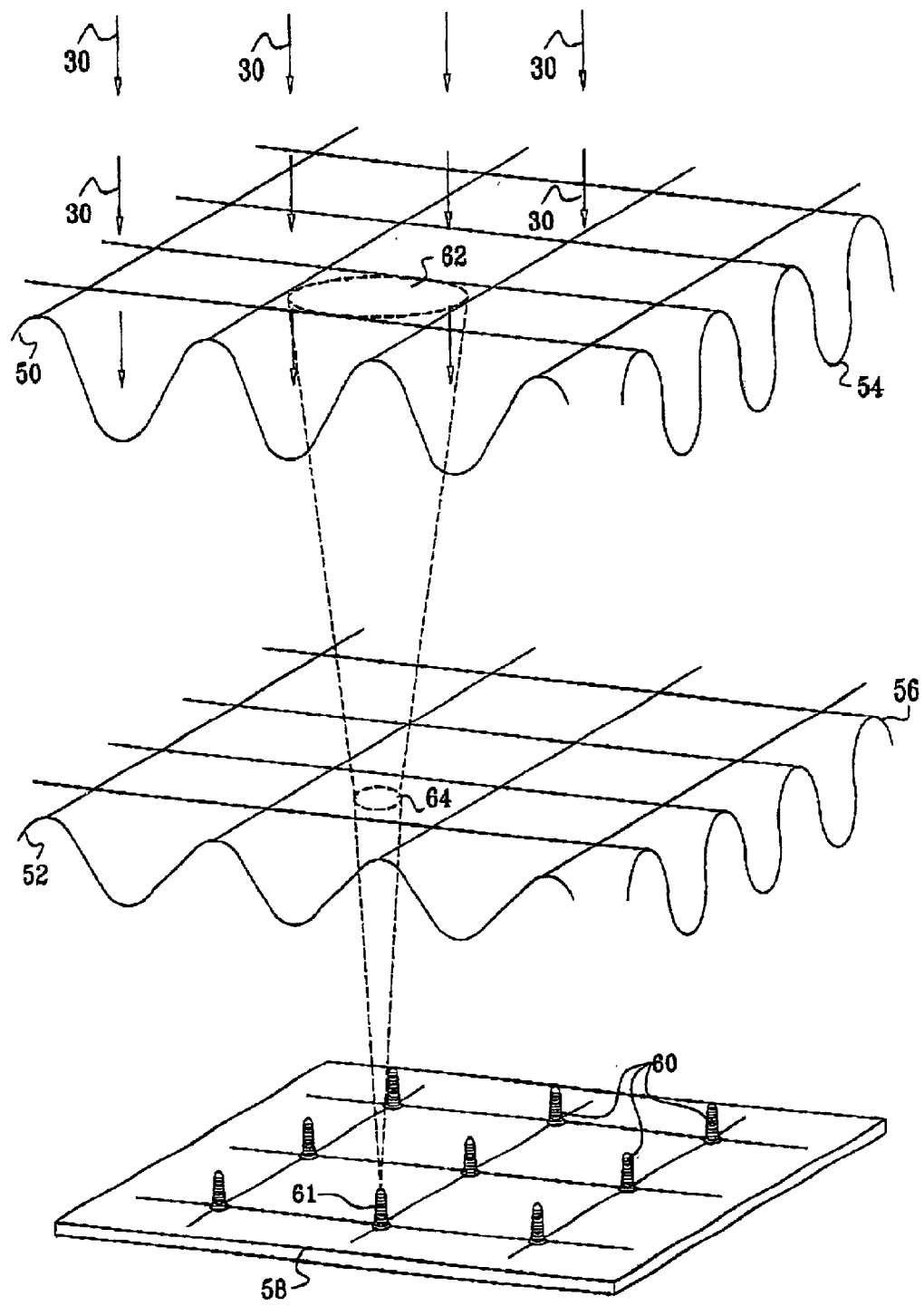
FIG. 15 is a schematic representation of a system, according to another preferred embodiment of the present invention, similar to that shown in FIG. 6, but incorporating two sets of standing waves arranged at an angle to each other, such that the beam is squeezed into a two dimensional array of localized spot structures.

Reference is now made to FIG. 15, which is a schematic representation of a system, according to another preferred embodiment of the present invention, similar to that shown in FIG. 6 but incorporating a first set of standing waves 50, 52, and a second set of standing waves 54, 56, arranged at an angle to the first set, such that the beam is squeezed in two dimensions to generate on the substrate 58 a two dimensional array of localized spot structures 60, similar to those shown in FIG. 13. In the preferred embodiment shown in FIG. 15, each set of standing waves comprises only two stacked standing waves, each standing wave providing one stage of squeezing, though it is to be understood that each set may preferably be constructed of more successive standing wave gratings, according to any of the previously described embodiments. In order to simplify the drawing, the path of the atomic or molecular beam undergoing squeezing by the system is shown for only one of the intersection regions 62, 64 of the two sets of angularly aligned standing waves, though it is to be understood that the whole beam area is focused onto the deposited pattern 60 shown on the substrate 58 for all of the crossing points. Furthermore, the two sets of standing waves are shown to be orthogonally aligned, though it is to be understood that they can be aligned at any angle. Furthermore, both of the components of each of the orthogonal sets of standing waves are shown aligned at the same distance downstream of the beam, though it is to be understood that each may be aligned along the beam path at its own predetermined position, and have its own squeezing parameters independent of the other set.

It will be appreciated by persons skilled in the art that the present invention is not limited by what has been particularly shown and described above. Rather the scope of the present invention includes both combinations and subcombinations of various features described hereinabove as well as variations and modifications thereto which would occur to a person of skill in the art upon reading the above description and which are not in the prior art.

I claim:

1. A method for focusing a beam comprising atomic species, comprising the steps of:

forming a collimated beam of said atomic species;

providing a first plurality of electromagnetic standing waves of essentially identical spatial period and having their planes parallel to each other, arranged serially across the path of said beam at predetermined distances from each other, said standing waves being aligned laterally such that their nodes are collinear; and directing said collimated beam through said standing waves.

2. The method of claim 1 and also comprising the step of disposing a substrate at a predetermined location relative to said plurality of standing waves, such that the atomic species of said beam are deposited onto said substrate.

3. The method of claim 2 and wherein at least two of said electromagnetic standing waves have different intensities.

4. The method of claim 2 and wherein the intensities of the standing waves and their locations are determined by optimization of the deposition of said atomic species on said substrate.

5. The method of claim 4 and wherein the effects of longitudinal velocity distribution of said beam are reduced such that said atomic species are deposited on said substrate in sharp edged patterns and having a reduced background of deposited atoms between said patterns.

6. The method of claim 2 and also comprising the step of arranging said predetermined distances such that each serially successive electromagnetic standing wave down said beam path is located at the position of minimal beam width resulting from the traverse of said beam through the previous standing wave of said plurality of standing waves.

7. The method of claim 2 and also comprising the step of performing mutual movement of said substrate relative to said plurality of standing waves.

8. The method of claim 7 wherein said mutual movement of said substrate relative to said plurality of standing waves is performed by movement of said plurality of standing waves.

9. The method of claim 8 wherein said movement of at least one of said plurality of standing waves is performed by adjusting the mutual phases of said laser beams whose interference generates said standing wave.

10. The method of claim 2 and wherein the effects of transverse velocity distribution of said beam are reduced such that said atomic species are deposited on said substrate in sharp edged patterns and having a reduced background of deposited atoms between said patterns.

11. The method of claim 2 and also comprising the step of disposing at least one plate having at least one aperture in the path of said beam.

12. The method of claim 11 and wherein the dimension of said at least one aperture is smaller than the minimal spatial period of said plurality of standing waves, such that said beam is deposited essentially as a single pile of said atomic species.

13. The method of claim 11, and wherein the dimension of said at least one aperture is larger than at least two spatial periods of said plurality of standing waves, such that said beam is deposited essentially as a plurality of piles of atomic species.

14. The method of claim 1 and wherein said electromagnetic standing waves have essentially the same intensity.

15. The method of claim 1 and wherein at least two of said electromagnetic standing waves have different intensities.

16. The method of claim 1 and wherein at least one of said electromagnetic standing waves is generated by interference between laser beams.

17. The method of claim 16 and wherein at least one of said standing waves is aligned laterally by adjusting the mutual phases of said laser beams whose interference generates said standing waves.

18. The method of claim 1 and wherein the intensities of said standing waves and their locations are determined by optimization of the focusing effect.

19. The method of claim 1 and also comprising the steps of:
   providing at least one additional electromagnetic standing wave, having its plane parallel to the planes of said plurality of parallel electromagnetic standing waves; and
   aligning said at least one additional electromagnetic standing wave at an angle to said first plurality of electromagnetic standing waves, such that said beam is focused in a two dimensional array.

20. The method of claim 19 and wherein said at least one additional electromagnetic standing wave is co-planar with at least one of the electromagnetic waves of said first plurality of electromagnetic standing waves.

21. The method of claim 19 and wherein said at least one additional electromagnetic wave and said first plurality of parallel electromagnetic standing waves are essentially orthogonal.

22. The method of claim 19 and wherein the spatial periods of said at least one additional electromagnetic standing wave and of said first plurality of parallel electromagnetic standing waves are essentially the same.

23. The method of claim 1 and also comprising the steps of:
   providing at least a second plurality of parallel electromagnetic standing waves of an essentially identical spatial period and having their planes parallel to the planes of said first plurality of parallel electromagnetic standing waves, said second plurality of standing waves also being arranged serially across the path of said atomic beam at predetermined distances from each other, and aligned laterally such that their nodes are collinear;
   and aligning the direction of the nodes of said second plurality of electromagnetic standing waves at an angle to that of said first plurality of electromagnetic standing waves, such that said beam is focused in a two dimensional array.

24. The method of claim 23 and wherein at least one of the electromagnetic standing waves of said first plurality of electromagnetic standing waves is co-planar with at least one electromagnetic standing wave of said second plurality of electromagnetic standing waves.

25. The method of claim 23 and wherein said first and said second pluralities of parallel electromagnetic standing waves are essentially orthogonal.

26. The method of claim 23 and wherein said spatial periods of said first plurality and said second plurality of parallel electromagnetic standing waves are the same.

27. The method of claim 1 and also comprising the step of arranging said predetermined distances such that each serially successive electromagnetic standing wave down said beam path is located at the position of minimal beam width resulting from the traverse of said beam through the previous standing wave of said plurality of standing waves.

28. The method of claim 1 and also comprising the step of disposing at least one plate having at least one aperture in the path of said beam.

29. The method of claim 28 and wherein the dimension of said at least one aperture is smaller than the minimal spatial period of said plurality of standing waves, such that said beam is focused to a single pile of said atomic species.

30. The method of claim 28, and wherein the dimension of said at least one aperture is larger than at least two spatial periods of said plurality of standing waves, such that said atomic beam is deposited essentially as a plurality of piles of atoms.

31. A system for performing deposition of atomic species comprising:
   a source omitting a collimated beam of said atomic species;
   a first plurality of electromagnetic standing waves of essentially identical spatial period and having their planes parallel to each other, arranged serially across the path of said beam at predetermined distances from each other, said standing waves being aligned laterally such that their nodes are collinear; and
   a substrate disposed at a predetermined location after the last one of said plurality of standing waves, such that said atomic species of said beam are deposited onto said substrate.

32. A system according to claim 31 and wherein at least one of said electromagnetic standing waves is generated by interference between laser beams.

33. A system according to claim 31 and wherein said atomic species are deposited in a set of parallel lines having a first spacing.

34. A system according to claim 33 and wherein mutual movement of said substrate relative to said plurality of standing waves is performed, such that said atomic species are deposited in a set of lines having a spacing closer than that of said first spacing.

35. A system according to claim 31 and also comprising at least one additional electromagnetic standing wave having its plane parallel to the planes of said first plurality of parallel electromagnetic standing waves, and aligned at an angle to said first plurality of electromagnetic standing waves, such that said atomic species are deposited in a two dimensional array.

36. A system according to claim 35 and wherein mutual movement of said substrate relative to said first plurality of standing waves is performed, such that said atomic species are deposited in a two dimensional pattern.

37. A system according to claim 35 and wherein said at least one additional electromagnetic standing wave is a second plurality of electromagnetic standing waves aligned at an angle to said first plurality of electromagnetic standing waves, such that said atomic species are deposited in a two dimensional array having a first spatial density.

38. A system according to claim 37 and wherein mutual movement of said substrate relative to at least one of said plurality of standing waves is performed, such that said atomic species are deposited in a two dimensional array of spatial density greater than said first spatial density.

39. A system according to claim 37 and wherein mutual movement of said substrate relative to said standing waves is performed, such that said atomic species are deposited in a two dimensional pattern.

40. A system according to claim 31 and wherein said atomic species form a mask pattern on said substrate.

41. A system according to claim 31 and wherein said atomic species form a doped region within said substrate.

42. A system according to claim 31 and wherein said atomic species form an optical grating structure on said substrate.

* * * * *